US012707625B2

(12) United States Patent
Hwu et al.

(10) Patent No.: US 12,707,625 B2
(45) Date of Patent: Aug. 11, 2026

(54) METHOD FOR FORMING MEMORY DEVICE

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Jenn-Gwo Hwu, Taipei City (TW); Sung-Wei Huang, Hsinchu City (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 649 days.

(21) Appl. No.: 18/194,795

(22) Filed: Apr. 3, 2023

(65) Prior Publication Data

US 2024/0334672 A1 Oct. 3, 2024

(51) Int. Cl.
*H10B 12/00* (2023.01)
*G11C 11/38* (2006.01)
(Continued)

(52) U.S. Cl.
CPC .............. *H10B 12/01* (2023.02); *G11C 11/38* (2013.01); *G11C 11/5628* (2013.01);
(Continued)

(58) Field of Classification Search
CPC ..... H10B 12/01; G11C 11/38; G11C 11/5628; G11C 11/5642; H01L 29/0626; H01L 29/66151
(Continued)

(56) References Cited

U.S. PATENT DOCUMENTS

2007/0181960 A1* 8/2007 Miyata ................ H01L 21/3105 257/E21.279
2011/0273930 A1* 11/2011 Chang ................ G11C 13/0002 365/175
(Continued)

OTHER PUBLICATIONS

Huang et al., "Improved Two States Characteristics in MIS Tunnel Diodes by Oxide Local Thinning Enhanced Transient Current Behavior", IEEE Transactions on Electron Devices, vol. 69, No. 12, Dec. 2022, pp. 7107-7112.
(Continued)

*Primary Examiner* — Xiaoming Liu
(74) *Attorney, Agent, or Firm* — Birch, Stewart, Kolasch & Birch, LLP

(57) ABSTRACT

A method includes forming a metal-insulator-semiconductor (MIS) structure, in which the MIS structure includes a semiconductor layer, an insulating layer over the semiconductor layer, and a metal electrode layer over the insulating layer; performing a soft breakdown process to the MIS structure to form a local breakdown portion in the insulating layer; performing a first write operation by supplying a first voltage pulse; performing a first read operation by supplying a second voltage pulse and detecting a first read current flowing through the MIS structure; performing a second write operation by supplying a third voltage pulse, in which the first voltage pulse has a higher voltage level than the third voltage pulse; and performing a second read operation by supplying a fourth voltage pulse and detecting a second read current flowing through the MIS structure, in which the first read current is different from the second read current.

20 Claims, 27 Drawing Sheets

(51) Int. Cl.
*G11C 11/56* (2006.01)
*H10D 8/01* (2025.01)
*H10D 62/10* (2025.01)

(52) U.S. Cl.
CPC ......... *G11C 11/5642* (2013.01); *H10D 8/053* (2025.01); *H10D 62/108* (2025.01)

(58) Field of Classification Search
USPC ..................................................... 365/189.04
See application file for complete search history.

(56) References Cited

U.S. PATENT DOCUMENTS

| | | | | |
|---|---|---|---|---|
| 2016/0064390 | A1* | 3/2016 | Choi | H10B 20/25 257/314 |
| 2018/0047898 | A1* | 2/2018 | Ridgeway | H10N 70/826 |
| 2021/0057488 | A1* | 2/2021 | Hwu | H10N 70/8833 |

OTHER PUBLICATIONS

Huang et al., "Transient Current Enhancement in MIS Tunnel Diodes With Lateral Electric Field Induced by Designed High-Low Oxide Layers", IEEE Transactions on Electron Devices, vol. 68, No. 12, Dec. 2021, pp. 6580-6585.

Lin et al., "Enhanced Transient Behavior in MIS(p) Tunnel Diodes by Trench Forming at the Gate Edge", IEEE Transactions on Electron Devices, vol. 68, No. 9, Sep. 2021, pp. 4189-4194.

Yang et al., "Gate Oxide Local Thinning Mechanism-Induced Sub-60 mV/Decade Subthreshold Swing on Charge-Coupled MIS(p) Tunnel Transistor", IEEE Transactions on Electron Devices, vol. 66, No. 1, Jan. 2019, pp. 279-285.

* cited by examiner

METHOD FOR FORMING MEMORY DEVICE

BACKGROUND

Dielectric breakdown is an important issue in the modern integrated circuits, especially under the circumstance of aggressive scaling, where the ultrathin gate oxide would suffer from a stronger electric field and a larger tunneling current. The oxide breakdown is commonly considered as a three-stage process: traps generated inside oxide under electrical stress, a locally conductive path forming within the dielectric, and a sudden increase in current through the conducting path causing further damage due to thermal runaway.

According to the severity of damage, oxide breakdown could be categorized into hard breakdown (HBD), where the leakage current increases dramatically and the oxide has lost the dielectric property, and soft breakdown (SBD), where the increase in leakage current is much less than that in HBD and the electronic device could still be functionable in most of the circuits. Oxide SBD has been shown to have several applications, including random number generator physically unclonable function (PUF), and memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
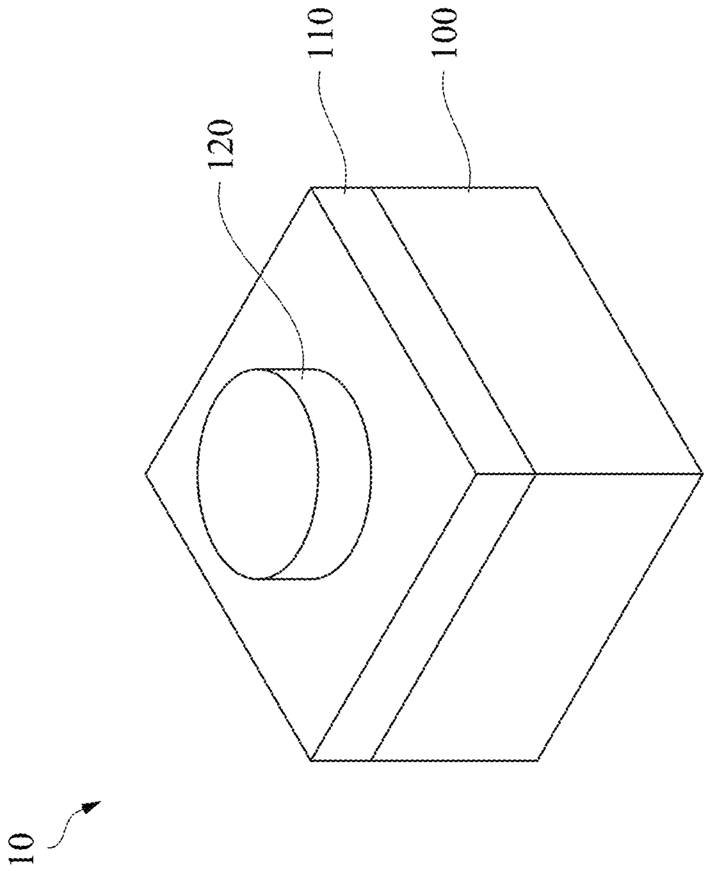
FIG. 1 is a schematic view of a metal-insulator-semiconductor (MIS) structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic view of a metal-insulator-semiconductor (MIS) structure in accordance with some embodiments of the present disclosure. Shown there is a MIS structure 10. The MIS structure 10 includes a semiconductor layer 100, an insulating layer 110 over the semiconductor layer 100, and a metal electrode layer 120 over the insulator layer 110. In some embodiments, the metal electrode layer 120 can also be referred to as a top gate. In some embodiments, the MIS structure 10 can also be referred to as a MIS cell.

In some embodiments, the semiconductor layer 100 may be made of Si, Ge, GaAs, $MoS_2$, or other suitable semiconductor material. The semiconductor layer 100 may be a p-type semiconductor layer or an n-type semiconductor layer. The insulating layer 110 may be made of dielectric material, such as silicon oxide (SiO2), aluminum oxide ($Al2O_3$), hafnium oxide ($HfO_2$), hBN, or other suitable dielectric material. The thickness of the insulating layer 110 is in a range from about 1.5 nm to about 10 nm. The metal electrode layer 120 may be made of metal, such as aluminum (Al), titanium nitride (TiN), gold (Au), tungsten (W), or other suitable metal. The metal electrode layer 120 may include suitable top profile, such as a circular shape in this case (e.g., radius is about 145 um), while other profiles may also be employed. In some embodiments, the top surface area of the metal electrode layer 120 is in a range from about 100 $nm^2$ to about 1 $mm^2$.

The MIS structure 10 of FIG. 1 can also be referred to as MIS tunnel diode. It has been shown that the MIS tunnel diode has the potential of dynamic memory usage. However, the improvement on the transient current still leaves much to be desired. In the present disclosure, oxide soft breakdown (SBD) is performed in MIS tunnel diode to improve the transient read current for dynamic memory usage. That is, during the soft breakdown process, the MIS structure 10 can be transferred to a MIS memory structure 10, which will be discussed in the following content.

Figure 2C:
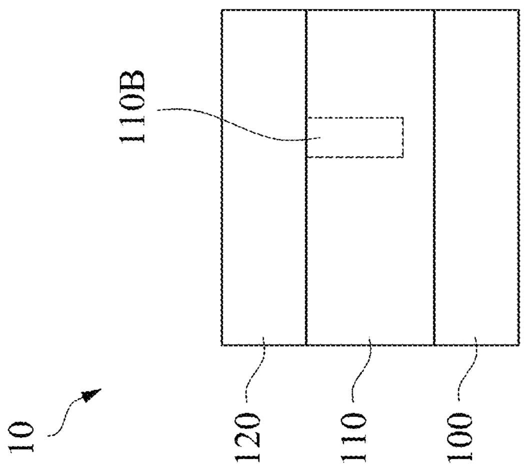
FIGS. 2A, 2B, and 2C are cross-sectional views of a MIS structure in accordance with some embodiments of the present disclosure.
Figure 2B:
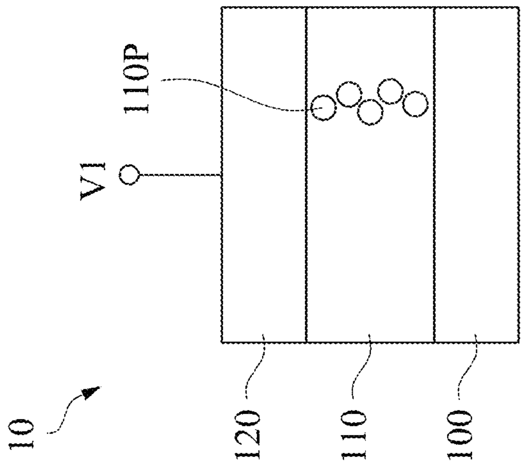
Figure 2A:
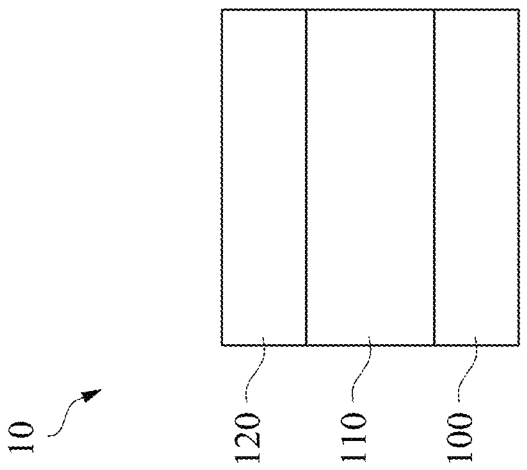

FIGS. 2A, 2B, and 2C are cross-sectional views of a MIS structure in accordance with some embodiments of the present disclosure, in which FIGS. 2A, 2B, and 2C are cross-sectional views of the MIS structure 10 of FIG. 1. In some embodiments, FIGS. 2A, 2B, and 2C discuss performing a soft breakdown (SBD) process to the MIS structure 10 shown in FIG. 1.

In the embodiments shown in FIGS. 2A, 2B, and 2C, the semiconductor layer 100 may be a p-type boron-doped (100)-oriented silicon wafer with a resistivity of 1-10 Ω-cm. The insulating layer 110 (e.g., $SiO_2$) has a thickness in a range from about 2 nm to 4 nm (e.g., 3 nm in this case). The metal electrode layer 120 (e.g., Al) has a thickness about in a range from about 140 nm to 160 nm (e.g., 150 nm in this case).

In FIG. 2A, the insulating layer 110 (e.g., oxide) has a substantially uniform thickness and there were few oxide traps. FIG. 2A is a condition of the MIS structure 10 prior to performing a soft breakdown process where no bias is applied to the MIS structure 10. Accordingly, the MIS structure 10 of FIG. 2A can be referred to as a "fresh" MIS structure.

In FIG. 2B, a soft breakdown process is performed to the MIS structure 10. In greater detail, a voltage V1 is applied to the metal electrode layer 120, bulk traps are generated. In the embodiments, the voltage V1 is a positive voltage and is controlled such that the MIS structure 10 is under a deep depletion regime, and a percolation path 110P is formed in the insulating layer 110. Accordingly, the voltage V1 can be referred to as deep depletion stress (DDS). In some embodiments, the voltage V1 can be a constant voltage level, and will result in a current-compliance condition. In some embodiments where the semiconductor layer 100 is p-type, positive voltage (V>0) supplied to the metal electrode layer 120 can be referred to as a reverse bias of the MIS structure 10. On the other hand, a negative voltage (V<0) supplied to the metal electrode layer 120 can be referred to as a forward bias of the MIS structure 10. In some embodiments, the positive voltage supplied to the p-type MIS structure 10 may cause the semiconductor layer 100 under a deep depletion regime. However, if a negative voltage (forward bias) is supplied to the p-type MIS structure 10, the semiconductor layer 100 may be under an accumulation regime.

In FIG. 2C, the damage due to the leakage current runaway through this conductive path 110P under the voltage V1 (e.g., DDS) would be restricted since the silicon was lightly doped, and the current is substrate-limited in the deep depletion regime. Soft breakdown would happen under this low current-compliance condition. That is, the voltage V1 is stopped until soft breakdown occurs. To obtain a soft breakdown of the insulating layer 110, the voltage V1 is in a range from 3V to about 10V (e.g., 5V in this case), and is applied for about 1 s to about 20 s (e.g., 10 s in this case). In some embodiments, if the voltage V1 is too low (e.g., much less than 2V), the semiconductor layer 100 may not be in the deep depletion regime, and thus soft breakdown may not happen. In other embodiments, if the voltage V1 is too high (e.g., much higher than 20V), the semiconductor layer 100 may not be in the deep depletion regime, and thus soft breakdown may not happen. In some embodiments, if the applying duration of voltage V1 is too short (e.g., much shorter than 1 s), the soft breakdown may not happen. If the applying duration of voltage V1 is too long (e.g., much longer than 20 s), there is no additional benefit because the soft breakdown may already happen under the disclosed range.

As a result, a breakdown portion 110B is formed in the insulating layer 110 of the MIDS structure 10. In some embodiments, the breakdown portion 110B extends from the interface of the insulating layer 110 and the metal electrode layer 120 downwardly into the middle portion of the insulating layer 110, and may terminates prior to reaching the interface of the insulating layer 110 and the semiconductor layer 100. The MIS structure 10 after the soft breakdown could be considered as an "oxide local thinning (OLT)" MIS structure for simplicity since the main tunneling current is highly localized. For OLT MIS structure 10, current saturates at a much lower voltage under positive bias, and an improved transient current was discovered by performing the pulsed voltage programs. In some embodiments, the breakdown portion 110B can also be referred to as OLT spot. In some embodiments, the "soft breakdown" may indicate that at least one local breakdown portion 110B is formed in the insulating layer 110. On the contrary, the "hard breakdown" may indicate that a large area (e.g., an entire insulating layer 110) of the insulating layer 110 is breakdown.

Instead of using a constant voltage for forming the OLT MIS structure 10 as described above, embodiments of the present disclosure also include using sweeping voltage to form the OLT MIS structure 10. That is, during performing the soft breakdown process to the MIS structure 10, the metal electrode layer 120 of the MIS structure 10 is supplied with a sweeping voltage. For example, the voltage may gradually increases during the soft breakdown process. In such embodiments, the current flowing through the MIS structure 10 may also increase during the soft breakdown process.

Embodiments of the present disclosure also include using sweeping voltage with current compliance to form the OLT MIS structure 10. That is, during performing the soft breakdown process to the MIS structure 10, the metal electrode layer 120 of the MIS structure 10 is supplied with a sweeping voltage. For example, the voltage may gradually increases during the soft breakdown process. However, the maximum current flowing through the MIS structure 10 is set up within a range from about 100 nA to about 1 mA. In such embodiments, setting current compliance is beneficial to control the severity of breakdown damage, which will make sure the damage to the insulating layer 110 may not be too severe, and may further prevent the insulating layer 110 from hard breakdown.

Embodiments of the present disclosure also include using a constant current stress to form the OLT MIS structure 10. That is, instead of using a constant voltage as described above, a constant current is supplied to the metal electrode layer 120 of the MIS structure 10 during the soft breakdown process. The constant current is in a range from about 10 nA to about 1 mA. In such embodiments, the current runaway during breakdown process will not be too severe since the device is under this current-compliance condition.

Embodiments of the present disclosure also include using a sweeping current to form the OLT MIS structure 10. That is, during performing the soft breakdown process, the metal electrode layer 120 of the MIS structure 10 is supplied with a sweeping current. For example, the current supplied to the metal electrode layer 120 of the MIS structure 10 may increase from 0 uA to about 10 uA. In such embodiments, when soft breakdown happens in the MIS structure 10, the measured voltage at the metal electrode layer 120 will drop immediately.

Embodiments of the present disclosure also include using a constant voltage with current compliance to form the OLT MIS structure 10. That is, during performing the soft breakdown process to the MIS structure 10, the metal electrode layer 120 of the MIS structure 10 is supplied with a constant voltage. However, the maximum current flowing through the MIS structure 10 is set up within a range from about 100 nA to about 1 mA. In such embodiments, setting current compliance is beneficial to control the severity of breakdown damage, which will make sure that the damage to the insulating layer 110 may not be too severe, and may further prevent the insulating layer 110 from hard breakdown.

Embodiments of the present disclosure also include using forward bias with current compliance to form the OLT MIS structure 10. That is, for a p-type MIS structure 10, a negative voltage or a negative current may be supplied to the metal electrode layer 120. However, if a negative voltage or a negative current is supplied to the metal electrode layer 120, the semiconductor layer 100 may be under an accumulation regime instead of the deep depletion regime as discussed above. Under the accumulation regime, hard breakdown is likely to occur in the insulating layer 110. To avoid hard breakdown, setting current compliance is beneficial to control the severity of breakdown damage, which will make sure that the damage to the insulating layer 110 may not be too severe, and may be able to form OLT spot in the insulating layer 110 when the semiconductor layer 100 is under accumulation regime (e.g., forward bias to MIS structure 10). Similarly, for an n-type MIS structure 10 (e.g., semiconductor layer 100 is n-type), a positive voltage or a positive current may be supplied to the metal electrode layer 120. However, if a positive voltage or a positive current is supplied to the metal electrode layer 120, the semiconductor layer 100 may be under an accumulation regime instead of the deep depletion regime. Moreover, current compliance is set up to control the severity of breakdown damage, and may be able to form OLT spot in the insulating layer 110 when the semiconductor layer 100 is under accumulation regime (e.g., forward bias to MIS structure 10). In some embodiments, the maximum current flowing through the MIS structure 10 is set up within a range from about 100 nA to about 1 mA.

Figure 3A:
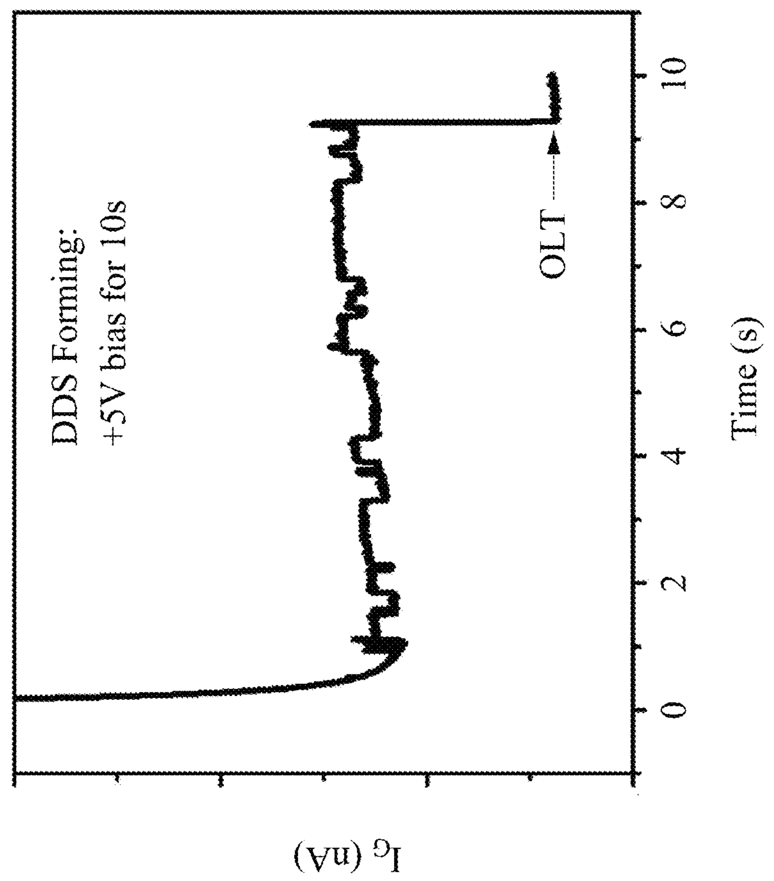
FIGS. 3A, 3B, and 3C are experiment results of a MIS structure in accordance with some embodiments of the present disclosure.
Figure 3B:
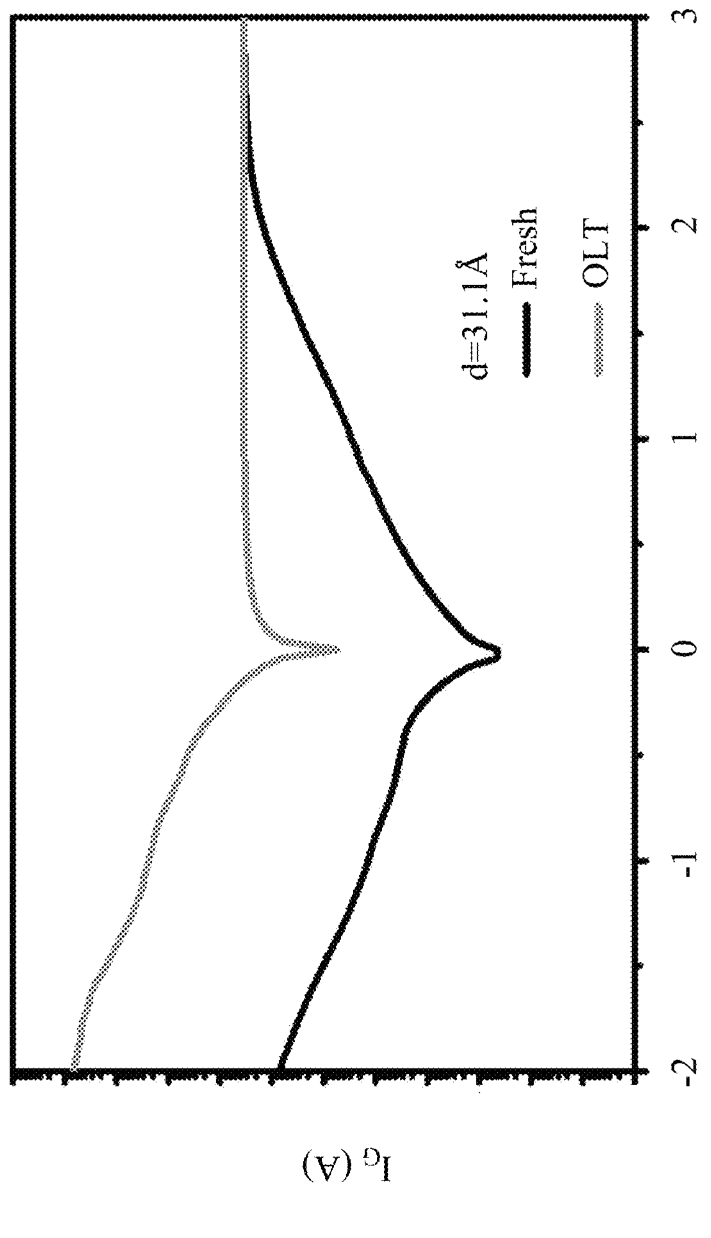
Figure 3C:
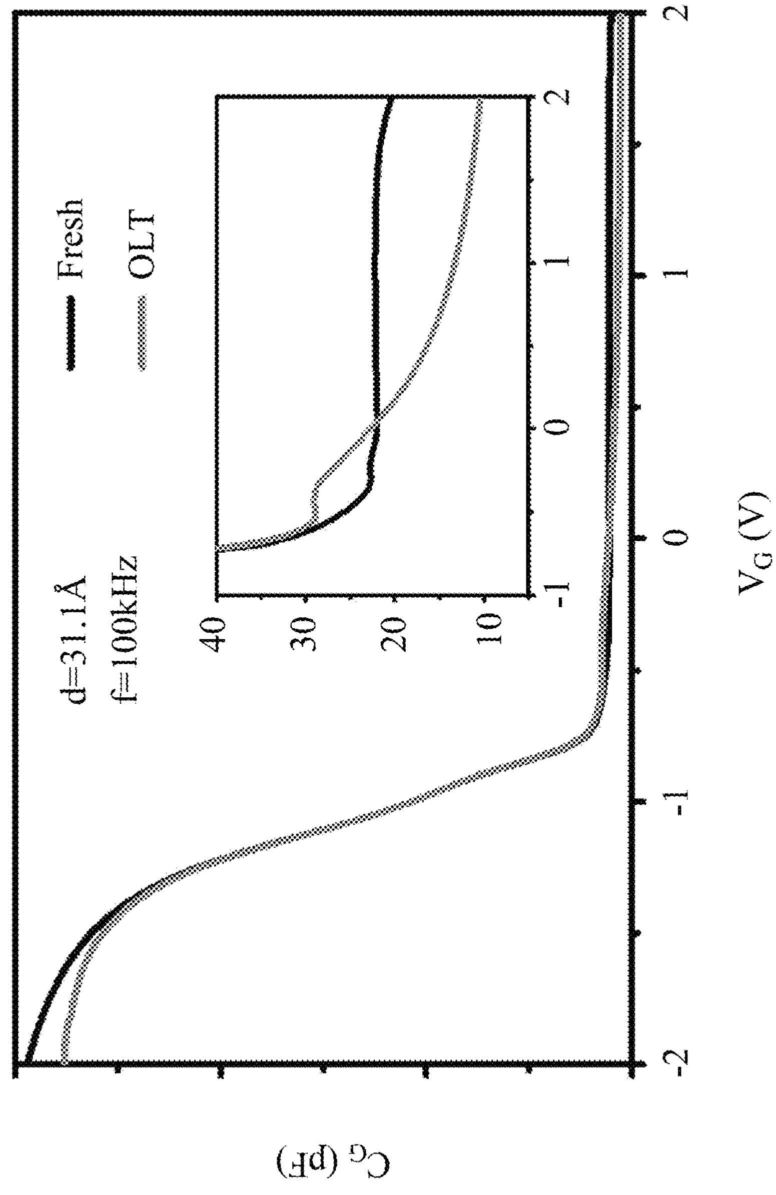

FIGS. 3A, 3B, and 3C are experiment results of a MIS structure in accordance with some embodiments of the present disclosure. In FIG. 3A, it can be seen that when a 5V voltage is applied to the MIS structure 10 for about 10 s, the current at the metal electrode layer 120 shows a sudden change of current magnitude. This is the signal when soft breakdown happens and an OLT spot (e.g., the breakdown portion 110B) has been formed in the insulating layer 110 of the MIS structure 10.

The current-voltage (I-V) and capacitance-voltage (C-V) characteristics of fresh and OLT MIS structures are shown in FIGS. 3B and 3C, respectively. The leakage current of the p-type OLT MIS under negative bias increases by orders of magnitude. Breakdown using DDS would be self-protective and the saturation current under large positive bias remains almost the same, meaning the oxide is not damaged catastrophically. At the same time, the current saturates at a much earlier voltage compared with fresh MIS since the inversion electrons would easily tunnel through the OLT spot, which could also be observed from the deep depletion phenomenon in the C-V curve of OLT MIS. This means the behavior of the MIS structure could be significantly affected by the OLT spot.

Figure 4:
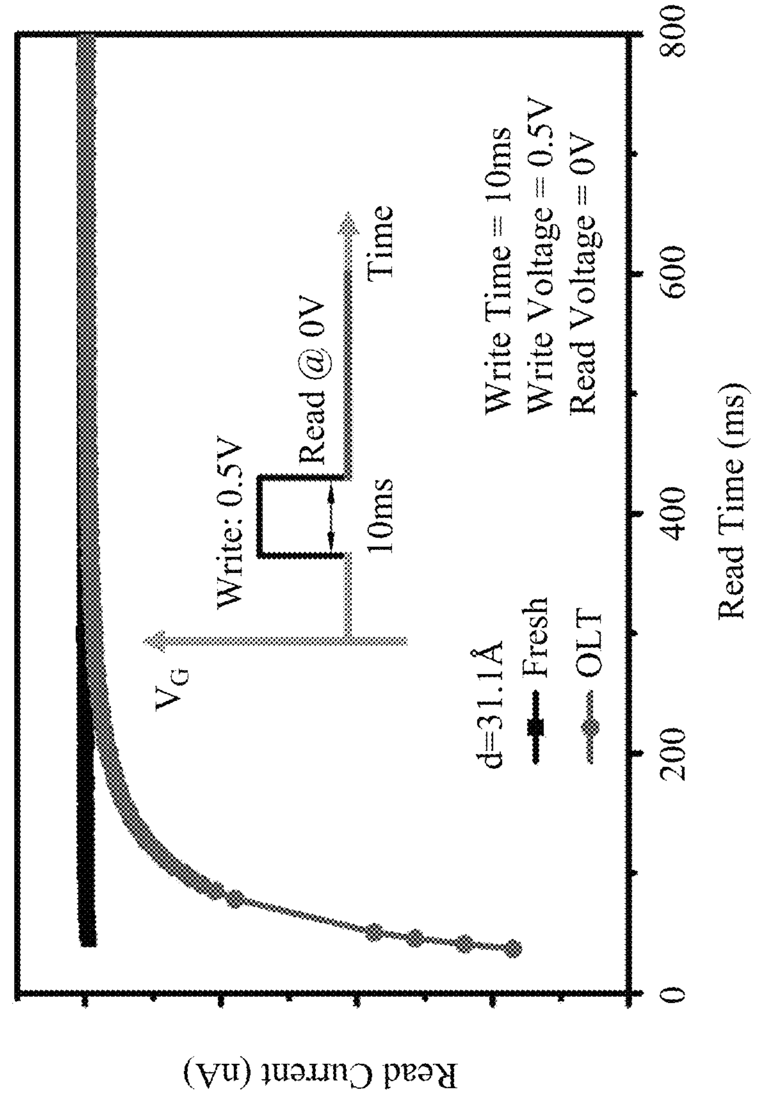
FIG. 4 is an experiment result of a MIS structure in accordance with some embodiments of the present disclosure.

FIG. 4 is an experiment result of a MIS structure in accordance with some embodiments of the present disclosure. Voltage pulsed program is performed to examine the transient behaviors of fresh MIS and OLT MIS. FIG. 4 shows the transient current read at 0 V after a 0.5 V/10 ms write pulse as the inset illustrated. The read currents at the first moment are −13 pA for fresh MIS and −1.57 nA for OLT MIS. The read current of OLT MIS is about two orders of magnitude the read current of fresh MIS. This property makes the OLT MIS a possible candidate for dynamic memory.

Figure 5A:
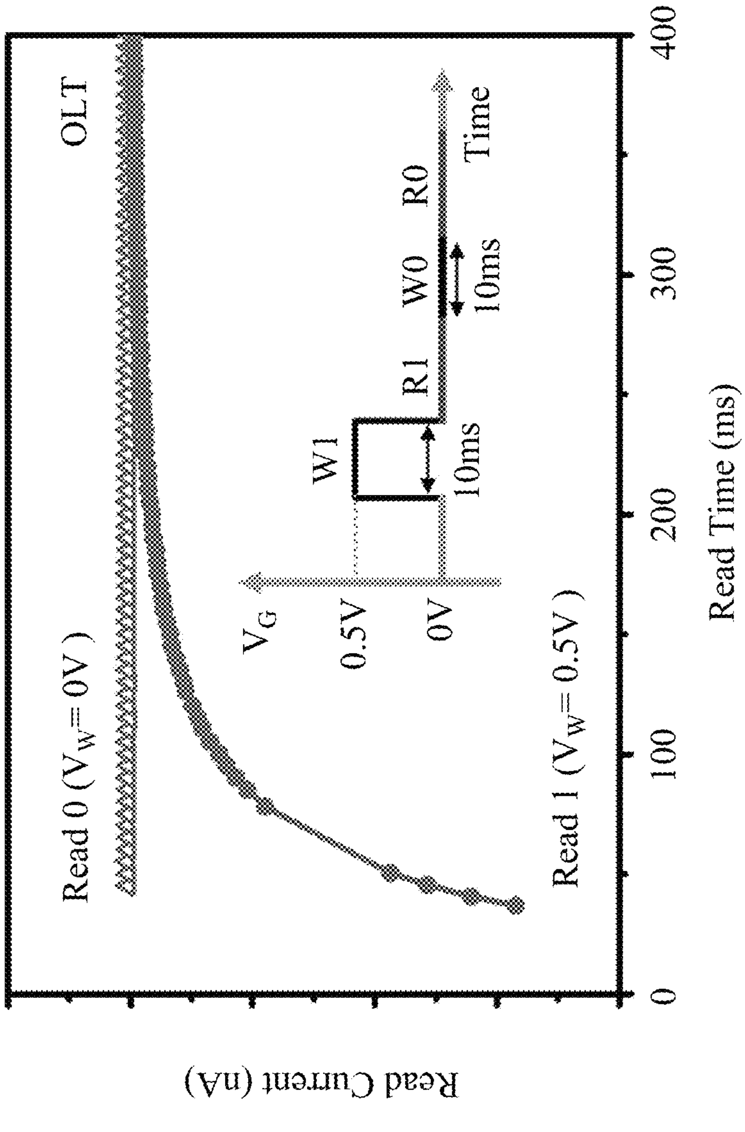
FIGS. 5A and 5B are experiment results of a MIS structure in accordance with some embodiments of the present disclosure.
Figure 5B:
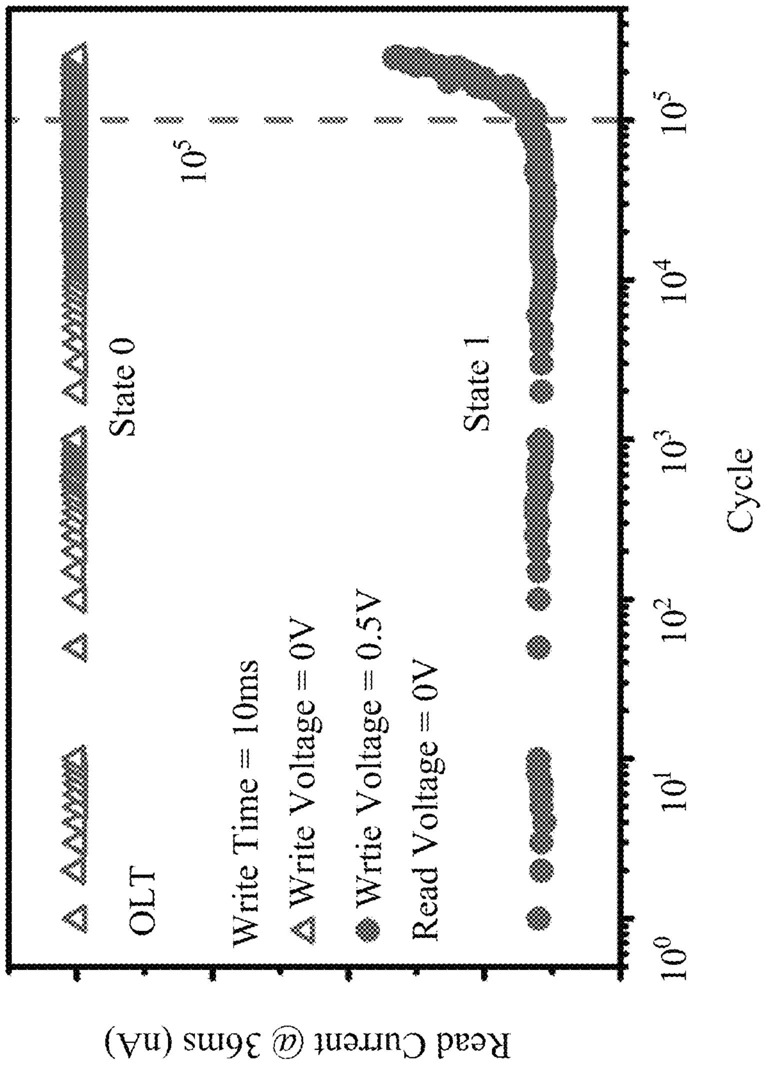

FIGS. 5A and 5B are experiment results of a MIS structure in accordance with some embodiments of the present disclosure. In FIG. 5A, for an OLT MIS, when using a 0 V and a 0.5 V pulse to write OLT MIS, a zero current and an enhanced negative current would be read out, respectively. These could be state 0 and 1 for a dynamic memory. In FIG. 5B, the endurance test is then performed, and the two current states are stable within $10^5$ cycles. The degradation afterward might result from the unstable nature of SBD. Therefore, it is suggested that a designed pattern to form an OLT region is desirable in the future to further improve the endurance.

Figure 6:
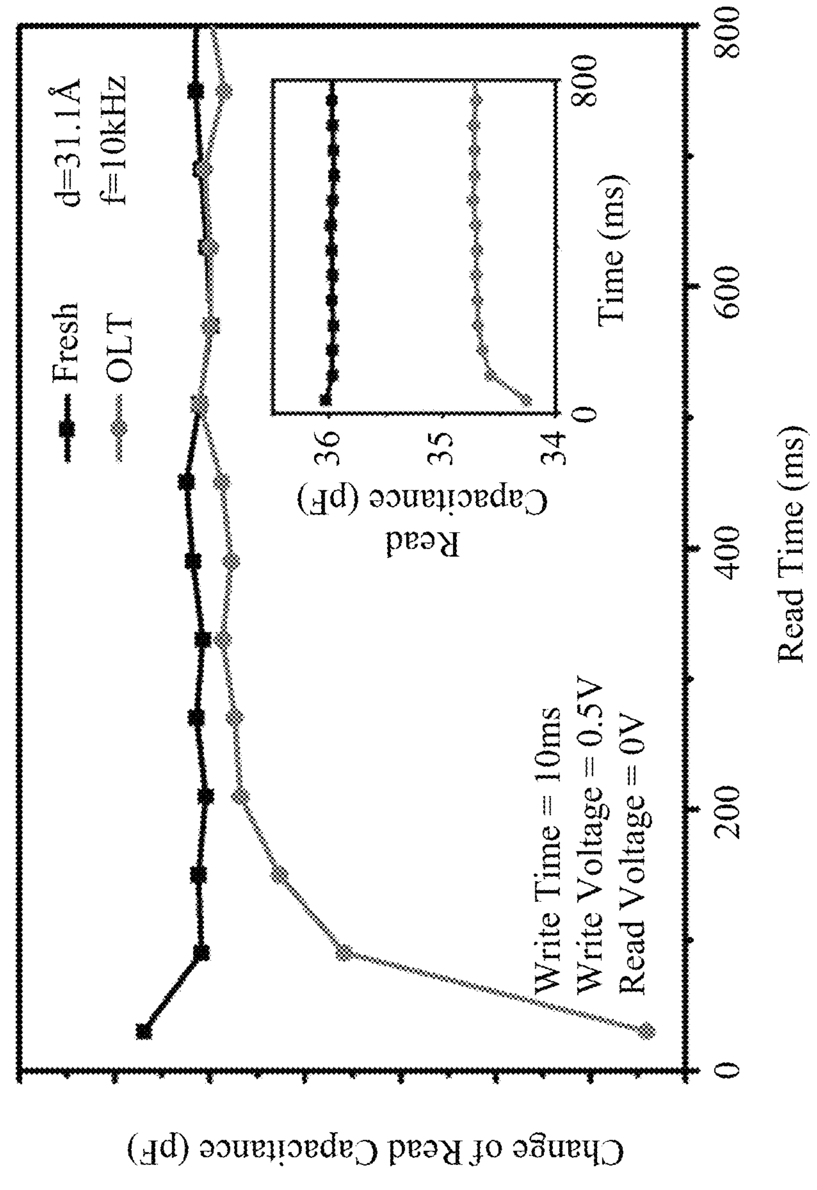
FIG. 6 is an experiment result of a MIS structure in accordance with some embodiments of the present disclosure.

FIG. 6 is an experiment result of a MIS structure in accordance with some embodiments of the present disclosure. To study the mechanism behind, the transient capacitance under the same voltage program is also measured. FIG. 6 shows the change in read capacitance compared with the steady-state capacitance at 0 V. The change in capacitance for OLT MIS is not only larger but also has an opposite sign compared with that for fresh MIS, which indicates that the carriers' movement inside the device might have a fundamental difference.

Figure 7A:
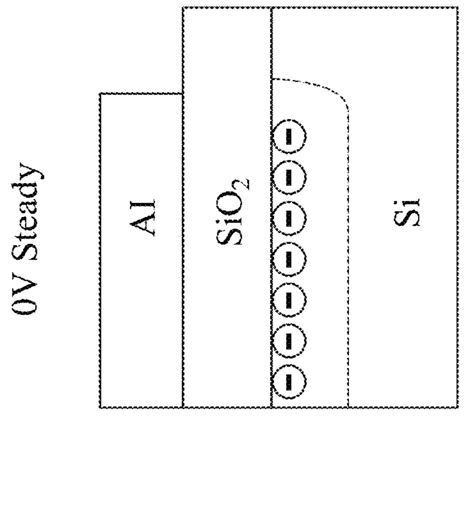
FIGS. 7A to 7F are cross-sectional views of a MIS structure in accordance with some embodiments of the present disclosure.
Figure 7B:
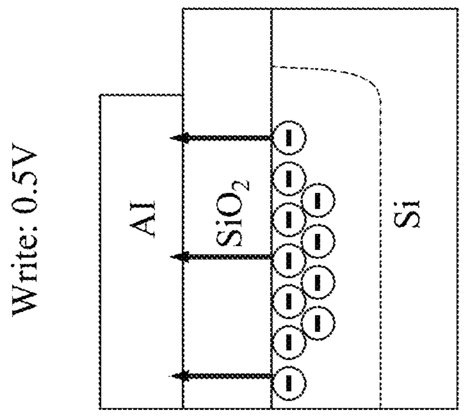
Figure 7C:
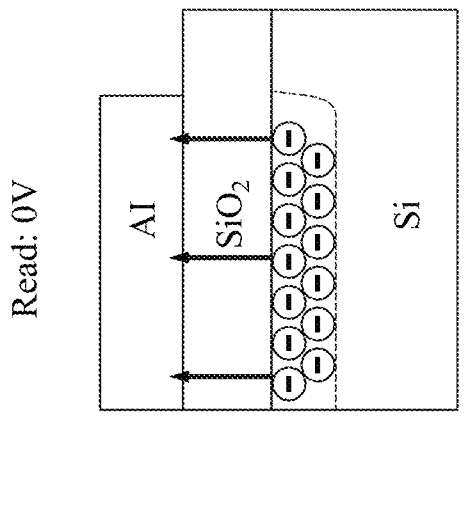
Figure 7D:
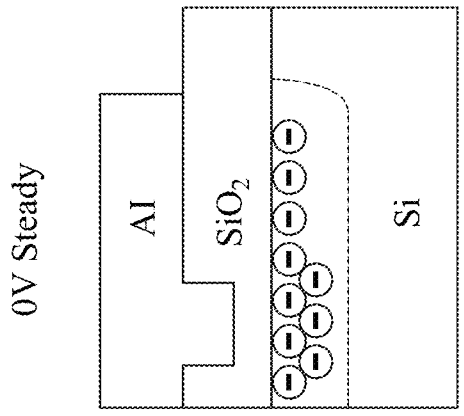

FIGS. 7A to 7F are cross-sectional views of a MIS structure in accordance with some embodiments of the present disclosure. In greater detail, FIGS. 7A, 7B, and 7C are cross-sectional views of a fresh MIS under 0V steady state, during write process with 0.5 V gate voltage, and at the beginning of the read process with 0 V gate voltage, respectively. FIGS. 7D. 7E, and 7F are cross-sectional views of an OLT MIS under 0V steady state, during write process with 0.5 V gate voltage, and at the beginning of the read process with 0 V gate voltage, respectively. The difference of transient behaviors of the fresh MIS and OLT MIS will be discussed below.

For fresh MIS, the transient behavior of fresh MIS could be understood by considering it as a capacitor. During positive voltage pulse (FIG. 7B), electrons would be charging to the silicon surface. As soon as the voltage switches back to 0 V (FIG. 7C), since there are excess electrons compared with 0 V steady-state (FIG. 7A), the depletion region will shrink immediately to balance the gate voltage. As the electrons gradually discharge, which leads to a negative current, the depletion region will also gradually expand to steady-state, which results in a decreasing read capacitance. FIGS. 7A to 7C schematically show the change in electron density and depletion region at 0 V steady-state, during write and read processes, respectively, for fresh MIS. Note that the arrows represent the direction of electron flow through the oxide. The tunneling of electrons through the thin oxide during read leads to a positive current component, which would degrade the negative read current for fresh MIS.

Figure 7E:
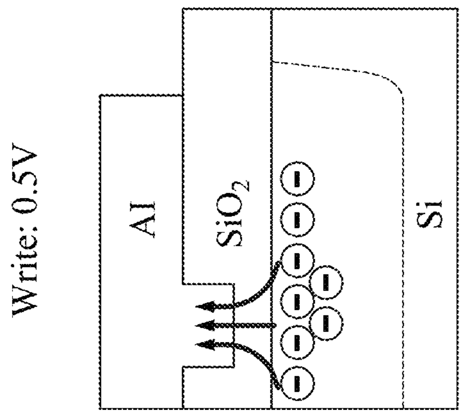
Figure 7F:
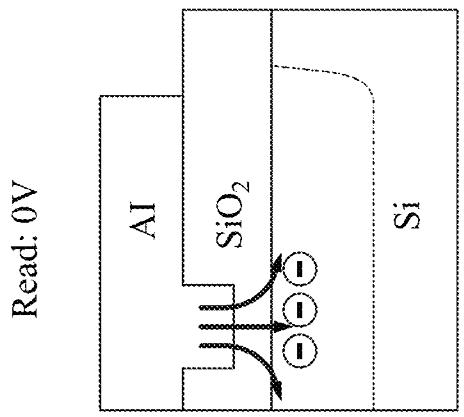

On the contrary, for OLT MIS, the capacitance is increasing during read (see FIG. 6), indicating that the depletion region is wider at the beginning of read (FIG. 7F) compared with steady-state (FIG. 7D), which further means that the electron density in silicon after a positive write pulse is unexpectedly lower than that in the steady state. The reason might be as follows. Since for OLT MIS, the tunneling current under low positive bias is still quite large, the electrons actually tunnel through the OLT spot instead of accumulating under oxide during the write process. As a result, the electrons are much fewer than the steady-state as soon as the voltage switches to 0 V. The large deficiency of electrons at the silicon surface might cause the electron quasi-Fermi level (QFL) EFn to be lower than the Fermi level of metal gate EFm, and the electrons would flow correspondingly from the gate to silicon through the OLT spot to help the device recover to the steady-state, which will lead to a negative current. Furthermore, the electron supply through OLT spot during read would be limited due to the extreme tunneling effect within a localized area of tens of $nm^2$. Therefore, it would take longer time for OLT MIS to recover the entire device to steady-state compared with fresh MIS. The schematic cross sections are shown in FIGS. 7D to 7F with arrows representing the direction of electron flow. The electrons flowing laterally within the inversion layer would cause a delay for OLT MIS to come back to steady-state, which also contributes to the improvement of transient behavior.

Figure 8A:
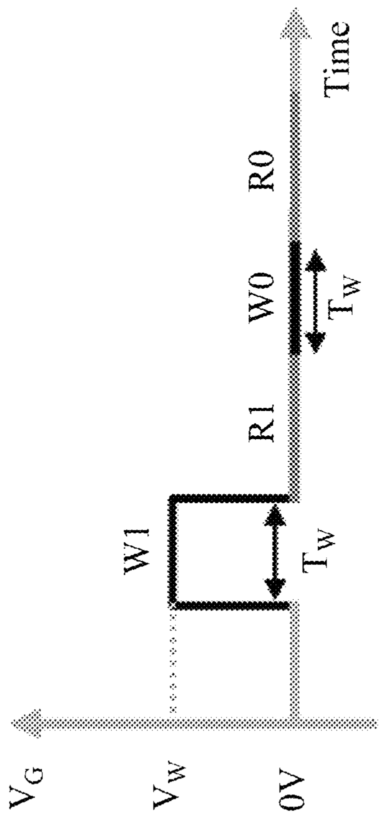
FIGS. 8A and 8B are operations of a MIS structure in accordance with some embodiments of the present disclosure.
Figure 8B:
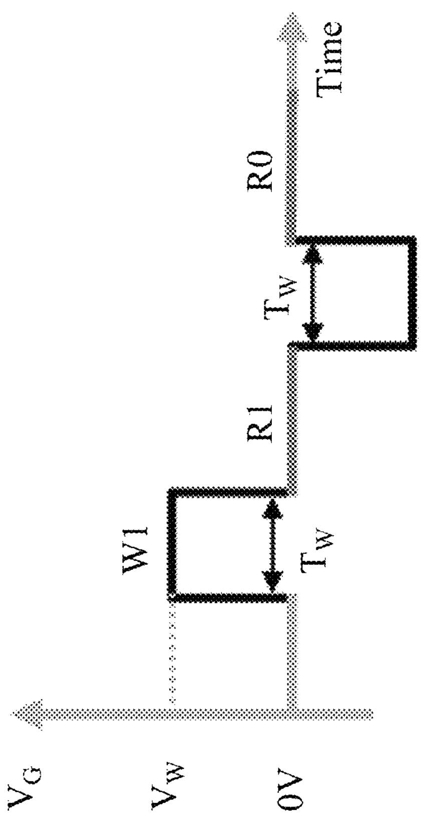

FIGS. 8A and 8B are operations of a MIS structure in accordance with some embodiments of the present disclosure. In greater detail, the operations of FIGS. 8A and 8B are performed to the OLT MIS structure 10 as described above. That is, soft breakdown occurs in the insulating layer 110 of the MIS structure 10.

In FIG. 8A, during the operation of the OLT MIS structure 10, a higher voltage W1 is used to write 1, and a negative read current will be detected during a read voltage R1. On the other hand, a lower voltage W0 is used to write 0, and a zero read current will be detected during a read voltage R0. In some embodiments, the higher voltage W1 is a positive voltage, such as 0.5V. In some embodiments, the lower voltage W0 is zero voltage. In some embodiments, the read voltage R1 and the read voltage R0 are both zero voltages. That is, the lower voltage W0 of write 0 is the same as the read voltage R1 and the read voltage R0. In some embodiments, the duration Tw of the pulse of higher voltage W1 and the duration Tw of the pulse of lower voltage W1 are between about 1 us to about 1 s (e.g., 1 ms in this case).

In FIG. 8B, during the operation of the OLT MIS structure 10, a higher voltage W1 is used to write 1, and a negative read current will be detected during a read voltage R1. On the other hand, a lower voltage W0 is used to write 0, and a zero read current will be detected during a read voltage R0. In some embodiments, the higher voltage W1 is a positive voltage, such as 0.5V. In some embodiments, the lower voltage W0 is a negative voltage, such as −0.5V. In some embodiments, the read voltage R1 and the read voltage R0 are both zero voltages. In some embodiments, the duration Tw of the pulse of higher voltage W1 and the duration Tw of the pulse of lower voltage W1 are between about 1 us to about 1 s (e.g., 1 ms in this case).

Figure 9B:
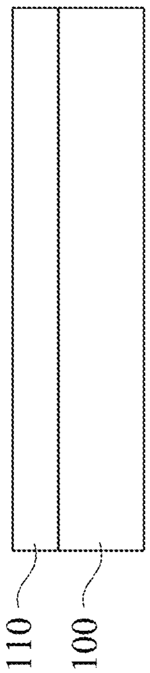
FIGS. 9A to 9E illustrate a method in various stages of forming a MIS structure in accordance with some embodiments of the present disclosure.
Figure 9A:
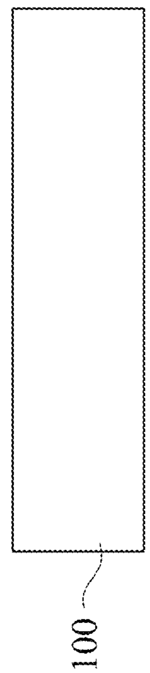

FIGS. 9A to 9E illustrate a method in various stages of forming a MIS structure in accordance with some embodiments of the present disclosure. In FIG. 9A, a semiconductor layer 100 is provided. In some embodiments, the semiconductor layer 100 may be made of Si, Ge, GaAs, $MoS_2$, or other suitable semiconductor material. In the embodiments of FIGS. 9A to 9E, the semiconductor layer 100 is a p-type semiconductor layer. That is, the semiconductor layer 100 may be doped with boron (B), gallium (Ga), indium (In), aluminium (Al), or the like.

In FIG. 9B, an insulating layer 110 is deposited over the semiconductor layer 100. The insulating layer 110 may be made of dielectric material, such as silicon oxide (SiO2), aluminum oxide ($Al2O_3$), hafnium oxide ($HfO_2$), hBN, or other suitable dielectric material. In some embodiments, the insulating layer 110 can be deposited using suitable process, such as chemical vapor deposition (CVD), physical vapor deposition (PVD), atomic layer deposition (ALD), or the like.

Figure 9C:
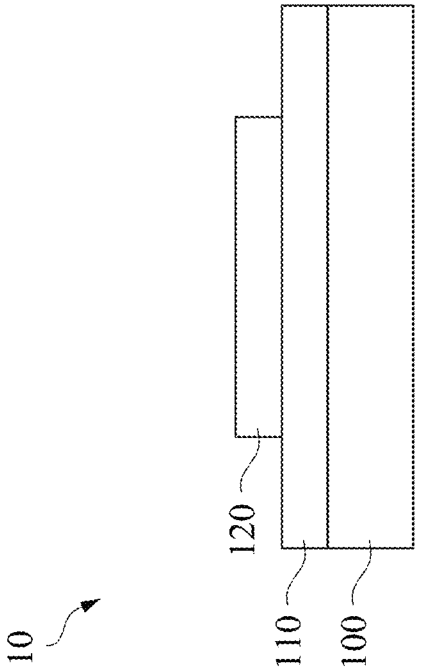

In FIG. 9C, a metal electrode layer 120 is formed over the insulating layer 110. In some embodiments, the metal electrode layer 120 may be made of metal, such as aluminum (Al), titanium nitride (TiN), gold (Au), tungsten (W), or other suitable metal. The metal electrode layer 120 may be formed by, for example, depositing a metal layer over the insulating layer 110, and then patterning the metal layer according to a predetermined pattern. As a result, a MIS structure 10 is formed.

Figure 9D:
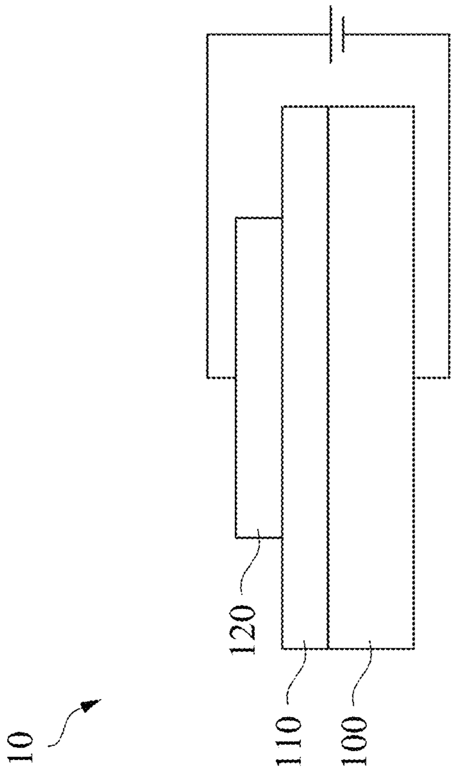

In FIG. 9D, a soft breakdown process is performed to the MIS structure 10. In some embodiment where the semiconductor layer 100 is a p-type semiconductor layer, a positive voltage is supplied to the metal electrode layer 120. In other embodiments, the soft breakdown process may also include, as discussed above, using a constant voltage, using a sweeping voltage, using a sweeping voltage with current compliance, using a constant current, using a sweeping current, or using a forward bias (or forward current) with current compliance. The mechanism of soft breakdown has been discussed above, and thus relevant details will not be repeated for brevity.

Figure 9E:
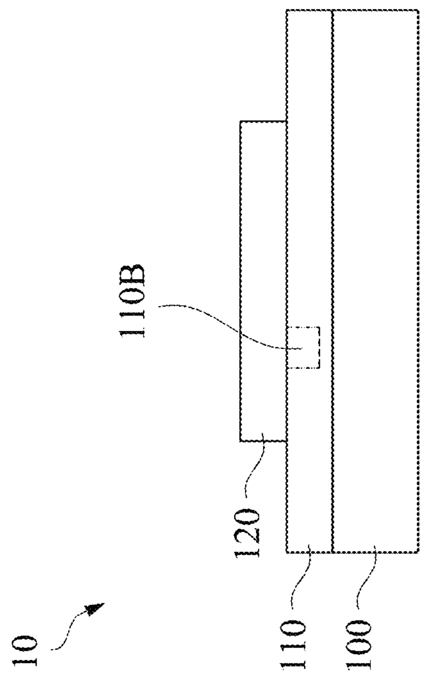

In FIG. 9E, after the soft breakdown process, a breakdown portion 110B is formed in the insulating layer 110, and the MIS structure 10 is transferred to a MIS memory structure 10. In some embodiments, the write and read operations of the MIS memory structure have been discussed above, and thus relevant details will not be repeated for brevity.

FIGS. 10A to 10E illustrate a method in various stages of forming a MIS structure in accordance with some embodiments of the present disclosure. FIGS. 10A to 10E are similar to FIGS. 9A to 9E, and thus relevant details will not be repeated for brevity.

Figure 10B:
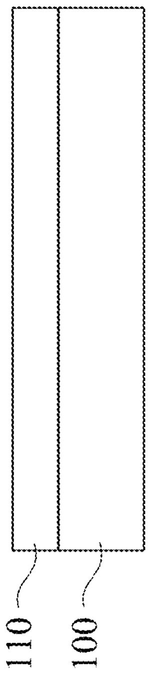
FIGS. 10A to 10E illustrate a method in various stages of forming a MIS structure in accordance with some embodiments of the present disclosure.
Figure 10A:
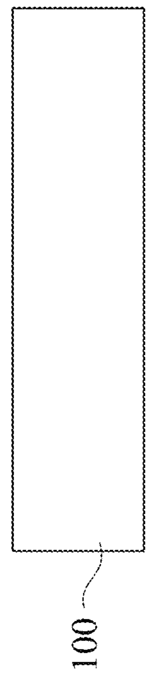

In FIG. 10A, a semiconductor layer 100 is provided. Different from the semiconductor layer 100 of FIG. 9A, the semiconductor layer 100 of FIG. 10A is an n-type semiconductor layer. That is, the semiconductor layer 100 may be doped with phosphorus (P), arsenic (As), or antimony (Sb), or the like.

Figure 10C:
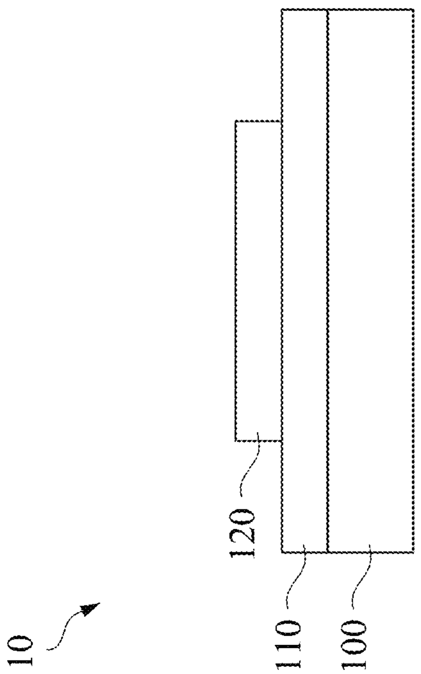
Figure 10D:
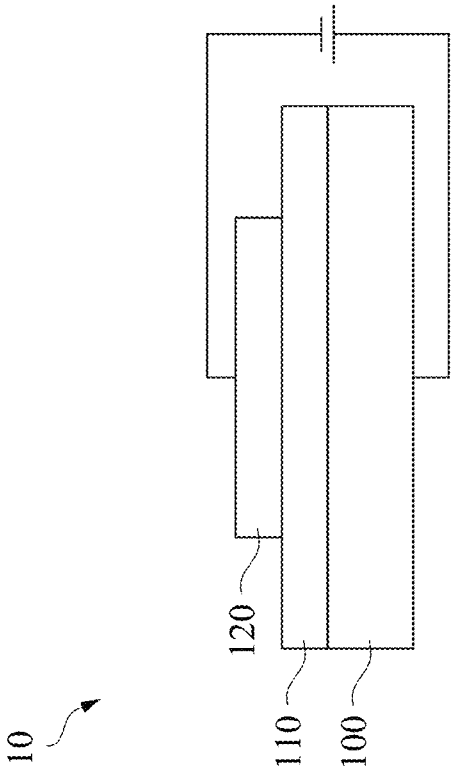

In FIG. 10B, an insulating layer 110 is deposited over the semiconductor layer 100. In FIG. 10C, a metal electrode layer 120 is formed over the insulating layer 110. In FIG. 10D, a soft breakdown process is performed to the MIS structure 10. In some embodiment where the semiconductor layer 100 is an n-type semiconductor layer, a negative voltage is supplied to the metal electrode layer 120. In other embodiments, the soft breakdown process may also include, as discussed above, using a constant voltage, using a sweeping voltage, using a sweeping voltage with current compliance, using a constant current, using a sweeping current, or using a forward bias (or forward current) with current compliance. The mechanism of soft breakdown has been discussed above, and thus relevant details will not be repeated for brevity.

Figure 10E:
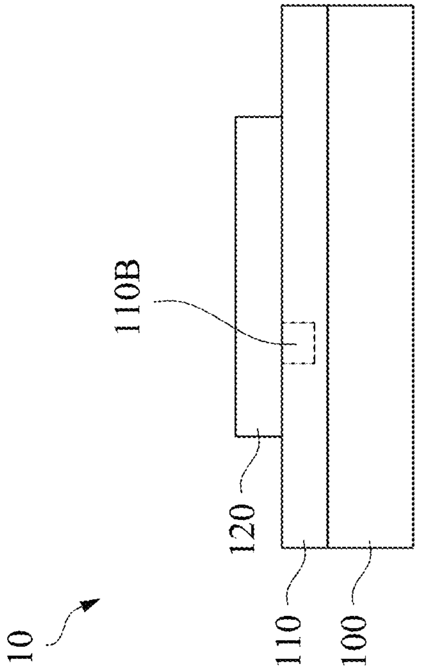

In FIG. 10E, after the soft breakdown process, a breakdown portion 110B is formed in the insulating layer 110, and the MIS structure 10 is transferred to a MIS memory structure 10. In some embodiments, the write and read operations of the MIS memory structure have been discussed above, and thus relevant details will not be repeated for brevity.

Figure 11B:
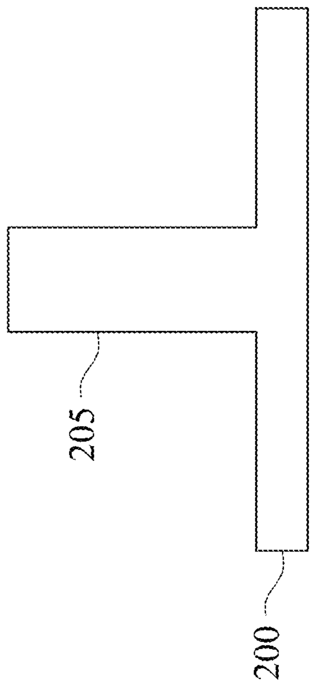
FIGS. 11A to 11F illustrate a method in various stages of forming a MIS structure in accordance with some embodiments of the present disclosure.
Figure 11A:
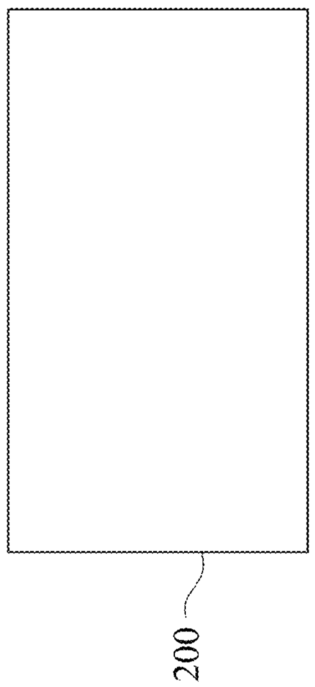

FIGS. 11A to 11F illustrate a method in various stages of forming a MIS structure in accordance with some embodiments of the present disclosure. In FIG. 11A, a semiconductor layer 200 is provided. In some embodiments, the semiconductor layer 200 may be made of Si, Ge, GaAs, $MoS_2$, or other suitable semiconductor material. In the embodiments of FIGS. 11A to 11F, the semiconductor layer 200 is a p-type semiconductor layer. That is, the semiconductor layer 200 may be doped with boron (B), gallium (Ga), indium (In), aluminium (Al), or the like.

In FIG. 11B, the semiconductor layer 200 is patterned to form a fin structure 205 protruding over the semiconductor layer 200. In some embodiments, the fin structure 205 may be formed by, for example, forming a patterned mask over the semiconductor layer 200, etching portions of the semiconductor layer 200 exposed by the patterned mask, and then removing the patterned mask, in which the un-etched portion of the semiconductor layer 200 protruding over the semiconductor layer 200 can be referred to as the fin structure 205.

Figure 11D:
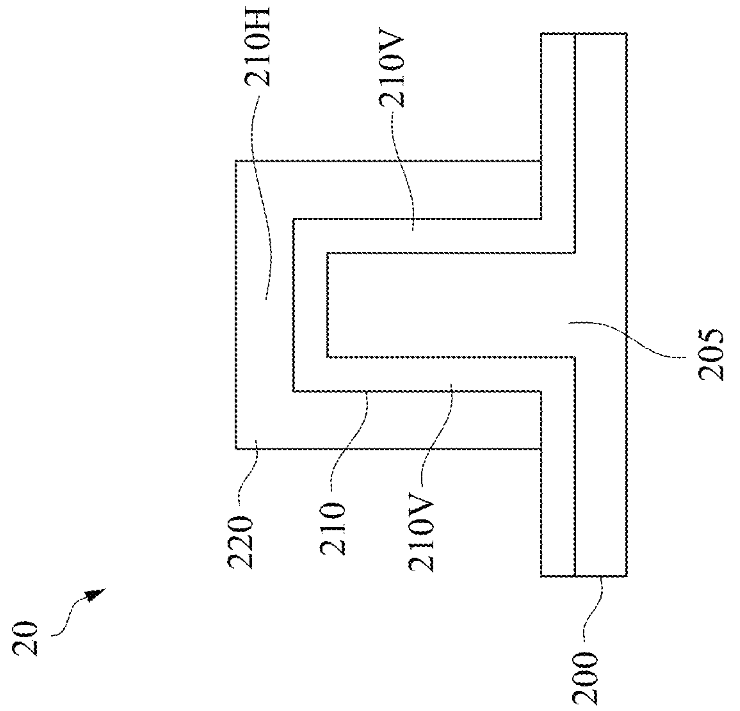
Figure 11C:
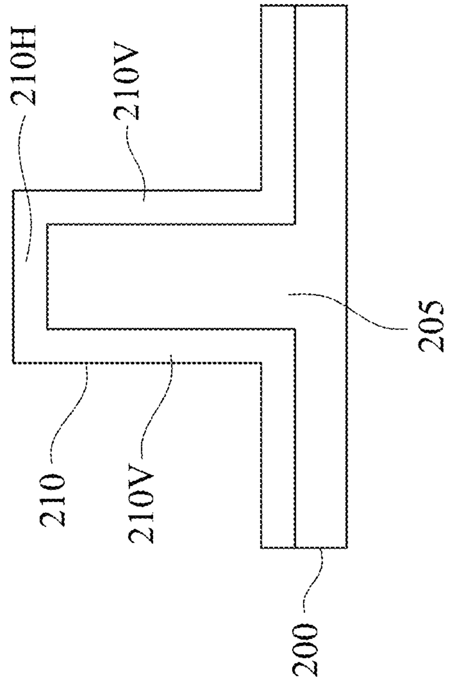

In FIG. 11C, an insulating layer 210 is deposited over the semiconductor layer 200 and lining the fin structure 205. In some embodiments, the insulating layer 210 may include a horizontal portion 110H over a top surface of the fin structure 205 and vertical portions 110V on opposite sidewalls of the fin structure 205. The insulating layer 210 may be made of dielectric material, such as silicon oxide ($SiO_2$), aluminum oxide ($Al2O_3$), hafnium oxide ($HfO_2$), hBN, or other suitable dielectric material. In some embodiments, the insulating layer 210 can be deposited using suitable process, such as chemical vapor deposition (CVD), physical vapor deposition (PVD), atomic layer deposition (ALD), or the like.

In FIG. 11D, a metal electrode layer 220 is formed over the insulating layer 210. In some embodiments, the metal electrode layer 220 may be made of metal, such as aluminum (Al), titanium nitride (TiN), gold (Au), tungsten (W), or other suitable metal. The metal electrode layer 220 may be formed by, for example, depositing a metal layer over the insulating layer 210, and then patterning the metal layer according to a predetermined pattern. As a result, a MIS structure 20 is formed.

Figure 11F:
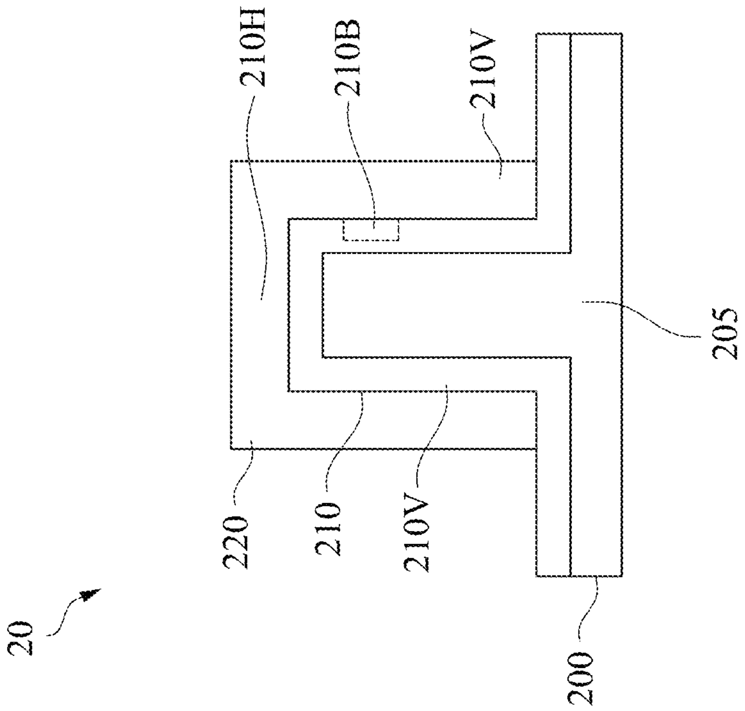
Figure 11E:
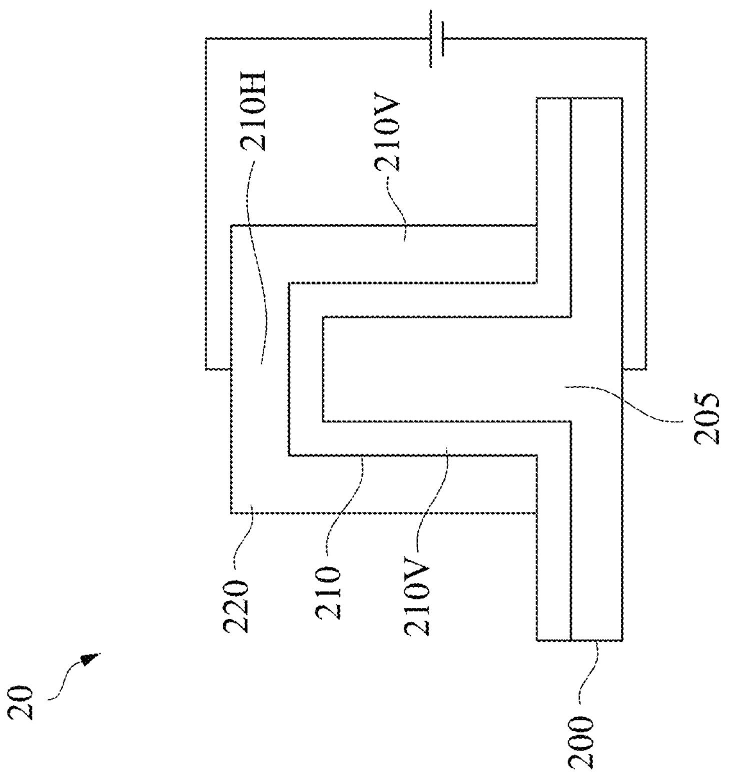

In FIG. 11E, a soft breakdown process is performed to the MIS structure 20. In some embodiment where the semiconductor layer 200 is a p-type semiconductor layer, a positive voltage is supplied to the metal electrode layer 220. In other embodiments, the soft breakdown process may also include, as discussed above, using a constant voltage, using a sweeping voltage, using a sweeping voltage with current compliance, using a constant current, using a sweeping current, or using a forward bias (or forward current) with current compliance. The mechanism of soft breakdown has been discussed above, and thus relevant details will not be repeated for brevity.

In FIG. 11F, after the soft breakdown process, a breakdown portion 210B is formed in the insulating layer 210, and the MIS structure 20 is transferred to a MIS memory structure 20. In greater detail, the breakdown portion 210B is formed in one of the vertical portions 210V of the insulating layer 210. In some embodiments, the write and read operations of the MIS memory structure have been discussed above, and thus relevant details will not be repeated for brevity.

Figure 12B:
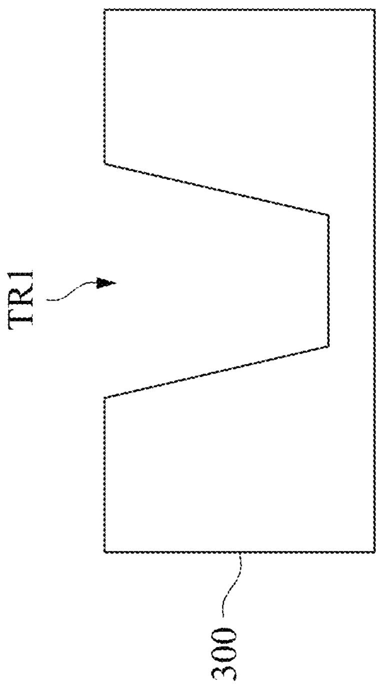
FIGS. 12A to 12F illustrate a method in various stages of forming a MIS structure in accordance with some embodiments of the present disclosure.
Figure 12A:
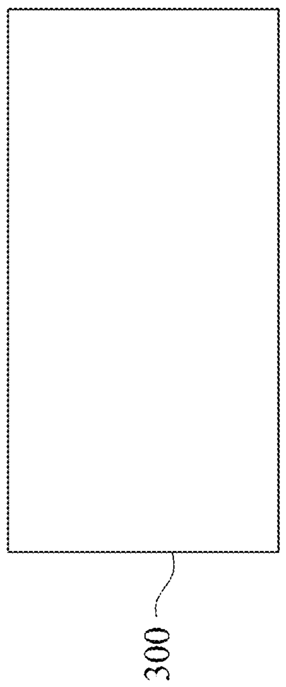

FIGS. 12A to 12F illustrate a method in various stages of forming a MIS structure in accordance with some embodiments of the present disclosure. In FIG. 12A, a semiconductor layer 300 is provided. In some embodiments, the semiconductor layer 300 may be made of Si, Ge, GaAs, $MoS_2$, or other suitable semiconductor material. In the embodiments of FIGS. 12A to 12F, the semiconductor layer 300 is a p-type semiconductor layer. That is, the semiconductor layer 300 may be doped with boron (B), gallium (Ga), indium (In), aluminium (Al), or the like.

In FIG. 12B, the semiconductor layer 300 is patterned to form a trench TR1 in the semiconductor layer 300. In some embodiments, the trench TR1 may be formed by, for example, forming a patterned mask over the semiconductor layer 200, etching the semiconductor layer 300 through an opening of the patterned mask to form the trench TR1 in the semiconductor layer 300, and then removing the patterned mask.

Figure 12C:
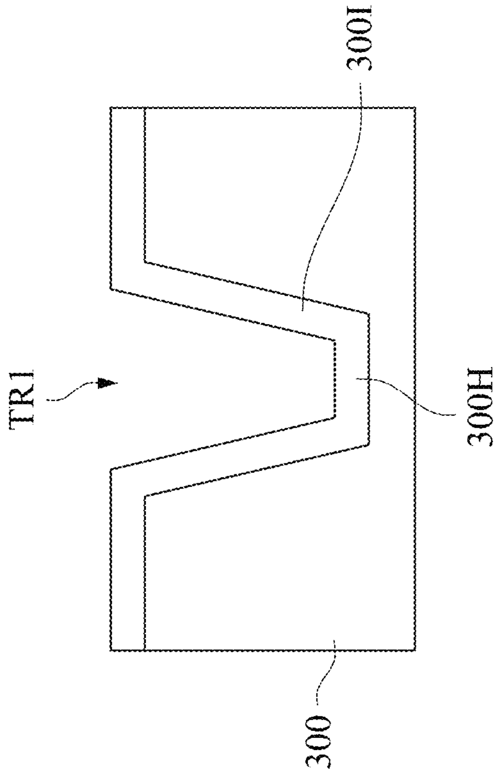

In FIG. 12C, an insulating layer 310 is deposited over the semiconductor layer 300 and lining the trench TR1. In some embodiments, the insulating layer 310 may include a horizontal portion 310H lining a bottom surface of the recess TR1, and inclined portions 3101 on opposite sidewalls of the recess TR1. The insulating layer 310 may be made of dielectric material, such as silicon oxide (SiO2), aluminum oxide ($Al2O_3$), hafnium oxide ($HfO_2$), hBN, or other suitable dielectric material. In some embodiments, the insulating layer 310 can be deposited using suitable process, such as chemical vapor deposition (CVD), physical vapor deposition (PVD), atomic layer deposition (ALD), or the like.

Figure 12D:
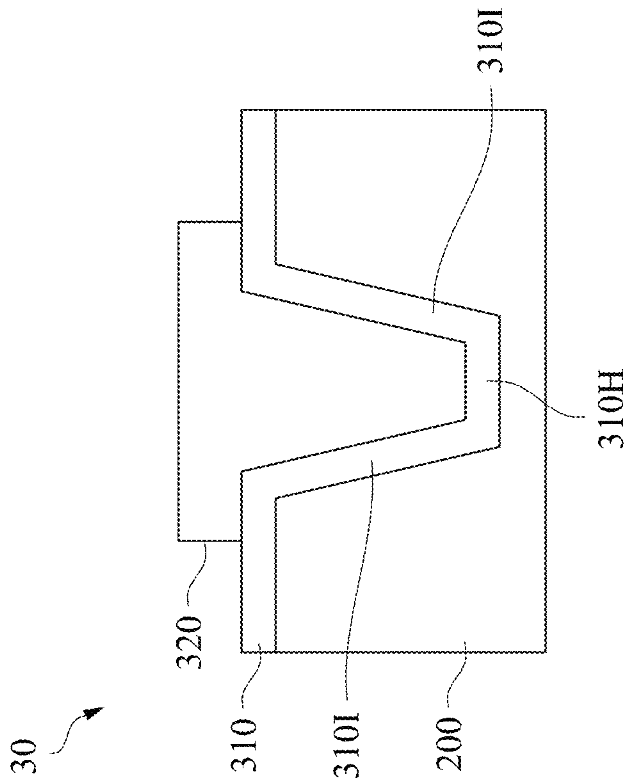

In FIG. 12D, a metal electrode layer 320 is formed filling the trench TR1 and over the insulating layer 310. In some embodiments, the metal electrode layer 320 may be made of metal, such as aluminum (Al), titanium nitride (TiN), gold (Au), tungsten (W), or other suitable metal. The metal electrode layer 320 may be formed by, for example, depositing a metal layer filling the trench TR1 and over the insulating layer 310, and then patterning the metal layer according to a predetermined pattern. As a result, a MIS structure 30 is formed.

Figure 12F:
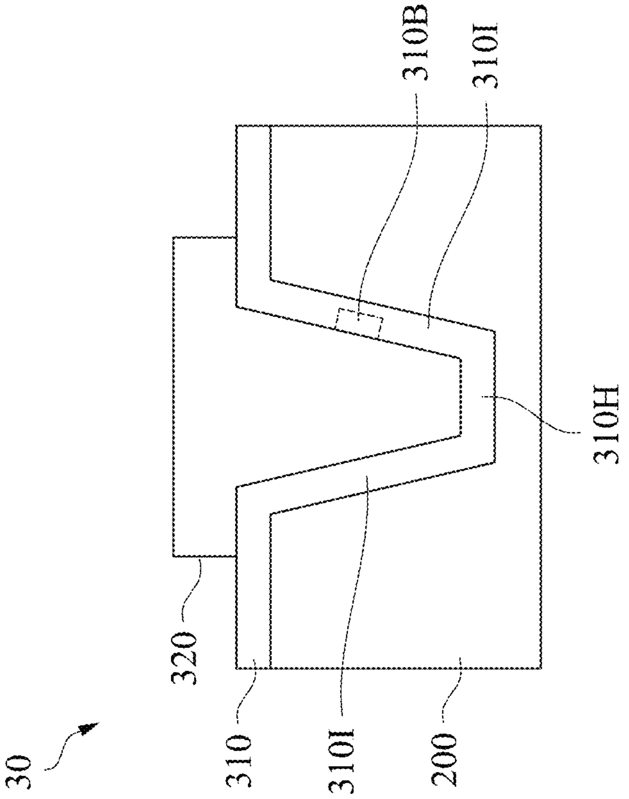
Figure 12E:
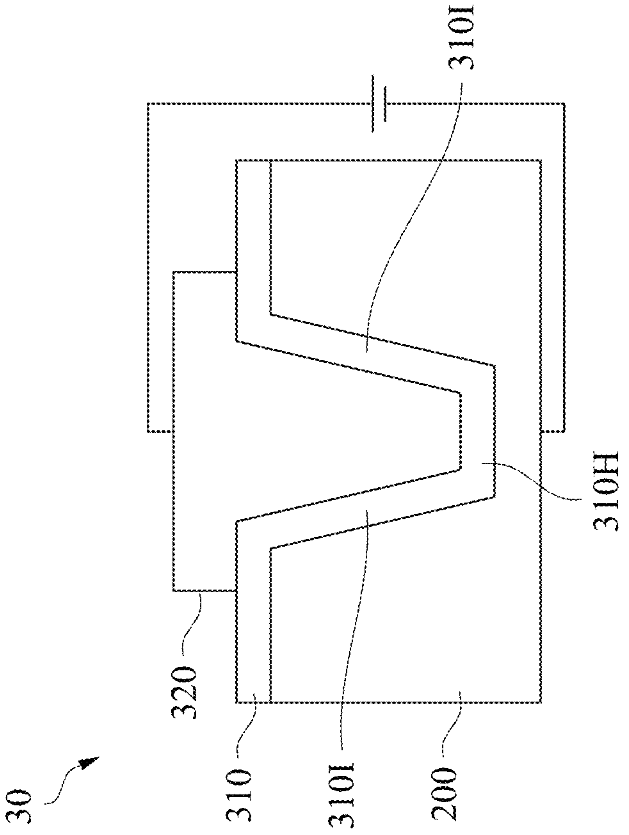

In FIG. 12E, a soft breakdown process is performed to the MIS structure 30. In some embodiment where the semiconductor layer 300 is a p-type semiconductor layer, a positive voltage is supplied to the metal electrode layer 320. In other embodiments, the soft breakdown process may also include, as discussed above, using a constant voltage, using a sweeping voltage, using a sweeping voltage with current compliance, using a constant current, using a sweeping current, or using a forward bias (or forward current) with current compliance. The mechanism of soft breakdown has been discussed above, and thus relevant details will not be repeated for brevity.

In FIG. 12F, after the soft breakdown process, a breakdown portion 310B is formed in the insulating layer 310, and the MIS structure 30 is transferred to a MIS memory structure 30. In greater detail, the breakdown portion 310B is formed in one of the inclined portions 310V of the insulating layer 310. In some embodiments, the write and read operations of the MIS memory structure have been discussed above, and thus relevant details will not be repeated for brevity.

Figure 13B:
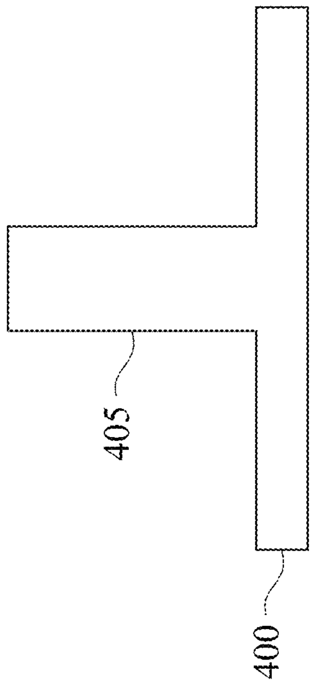
FIGS. 13A to 13E illustrate a method in various stages of forming a MIS structure in accordance with some embodiments of the present disclosure.
Figure 13A:
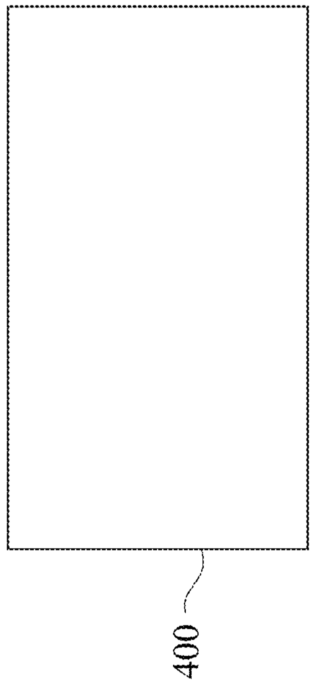

FIGS. 13A to 13E illustrate a method in various stages of forming a MIS structure in accordance with some embodiments of the present disclosure. In FIG. 13A, a semiconductor layer 400 is provided. In some embodiments, the semiconductor layer 400 may be made of Si, Ge, GaAs, $MoS_2$, or other suitable semiconductor material. In the embodiments of FIGS. 13A to 13E, the semiconductor layer 400 is a p-type semiconductor layer. That is, the semiconductor layer 400 may be doped with boron (B), gallium (Ga), indium (In), aluminium (Al), or the like.

In FIG. 13B, the semiconductor layer 400 is patterned to form a fin structure 405 protruding over the semiconductor layer 400. In some embodiments, the fin structure 405 may be formed by, for example, forming a patterned mask over the semiconductor layer 400, etching portions of the semiconductor layer 400 exposed by the patterned mask, and then removing the patterned mask, in which the un-etched portion of the semiconductor layer 400 protruding over the semiconductor layer 400 can be referred to as the fin structure 405.

Figure 13D:
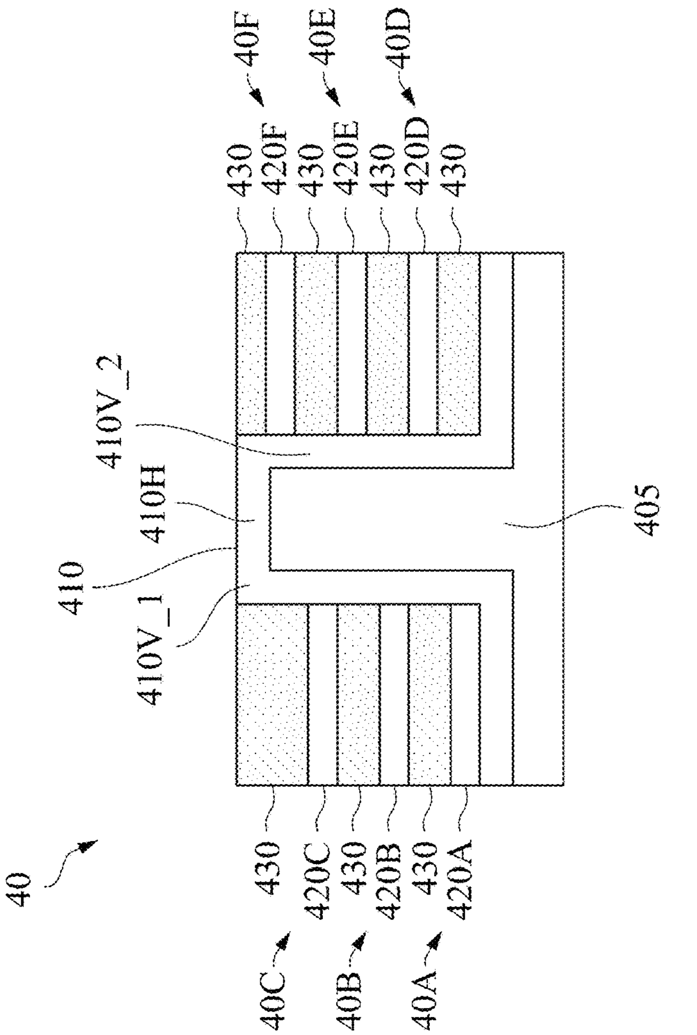
Figure 13C:
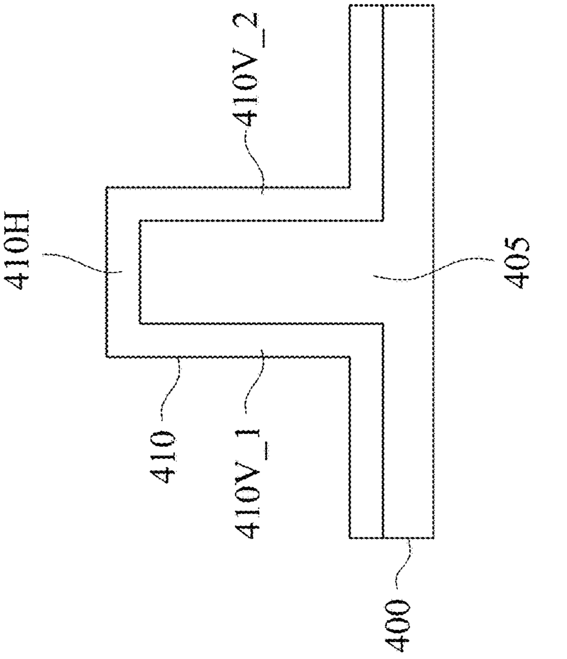

In FIG. 13C, an insulating layer 410 is deposited over the semiconductor layer 400 and lining the fin structure 405. In some embodiments, the insulating layer 410 may include a horizontal portion 410H over a top surface of the fin structure 405, and vertical portions 410V_1 and 410V_2 on opposite sidewalls of the fin structure 405. The insulating layer 410 may be made of dielectric material, such as silicon oxide (SiO2), aluminum oxide ($Al2O_3$), hafnium oxide ($HfO_2$), hBN, or other suitable dielectric material. In some embodiments, the insulating layer 410 can be deposited using suitable process, such as chemical vapor deposition (CVD), physical vapor deposition (PVD), atomic layer deposition (ALD), or the like.

In FIG. 13D, a plurality of metal electrode layers 420A, 420B, 420C, 420D, 420E, and 420F are formed over the semiconductor layer 400 and laterally adjacent to the fin structure 405. In greater detail, a stack of the metal electrode layers 420A, 420B, and 420C is formed on one side of the fin structure 405, and a stack of the metal electrode layers 420D, 420E, and 420F is formed on another side of the fin structure 405. The metal electrode layers 420A, 420B, 420C are formed vertically stacked one above another, and are in contact with the vertical portion 410V_1 of the insulating layer 410. Similarly, the metal electrode layers 420D, 420E, 420F are formed vertically stacked one above another, and are in contact with the vertical portion 410V_2 of the insulating layer 410.

Moreover, dielectric layers 430 are also formed to vertically separate and electrically isolate the metal electrode layers 420A, 420B, 420C, 420D, 420E, and 420F from each other. In some embodiments, sidewalls of the metal electrode layers 420A, 420B, 420C, 420D, 420E, and 420F are in contact with the insulating layer 410. In some embodiments, bottom surface of the metal electrode layer 420A may be in contact with the insulating layer 410. In some embodiments, the bottom surface of the metal electrode layer 420D may be separated from the insulating layer 410 through a dielectric layer 430.

After the formation of the metal electrode layers 420A, 420B, 420C, 420D, 420E, and 420F, a MIS structure 40 is formed, in which the MIS structure 40 may include a plurality of MIS cells 40A, 40B, 40C, 40D, 40E, and 40F. For example, the metal electrode layer 420A, the insulating layer 410, and the fin structure 405 may collective serve as the MIS cell 40A. The metal electrode layer 420B, the insulating layer 410, and the fin structure 405 may collective serve as the MIS cell 40B. The metal electrode layer 420C, the insulating layer 410, and the fin structure 405 may collective serve as the MIS cell 40C. The metal electrode layer 420D, the insulating layer 410, and the fin structure 405 may collective serve as the MIS cell 40D. The metal electrode layer 420E, the insulating layer 410, and the fin structure 405 may collective serve as the MIS cell 40E. The metal electrode layer 420F, the insulating layer 410, and the fin structure 405 may collective serve as the MIS cell 40F.

Figure 13E:
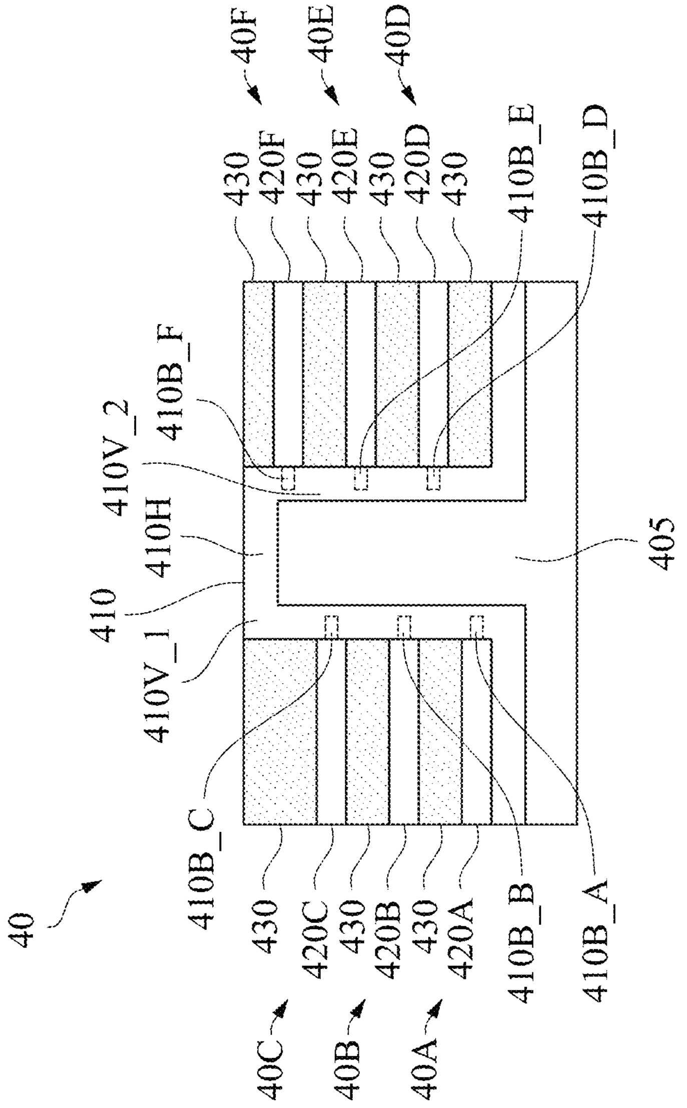

In FIG. 13E, soft breakdown processes are performed to the MIS structure 40. In greater detail, the soft breakdown processes are sequentially performed to the MIS cells 40A, 40B, 40C, 40D, 40E, and 40F, respectively, so as to sequentially transfer the MIS cells 40A, 40B, 40C, 40D, 40E, and 40F to MIS memory cells 40A, 40B, 40C, 40D, 40E, and 40F. In some embodiment where the semiconductor layer 400 is a p-type semiconductor layer, positive voltages may be sequentially supplied to the metal electrode layers 420A, 420B, 420C, 420D, 420E, and 420F until soft breakdowns happen in corresponding regions of the insulating layer 410. For example, a first soft breakdown process is performed to the MIS cell 40A by supplying a voltage to the metal electrode layer 420A until a breakdown portion 410B_A is formed in the insulating layer 410 and in contact with the metal electrode layer 420A. After the breakdown portion 410B_A is formed, a second soft breakdown process is performed to the MIS cell 40B by supplying a voltage to the metal electrode layer 420B until a breakdown portion 410B_B is formed in the insulating layer 410 and in contact with the metal electrode layer 420B. Soft breakdown processes may then be performed to the MIS cells 40C, 40D, 40E, and 40F in a similar manner, and will not be repeated for brevity. In some other embodiments, the soft breakdown processes may also include, as discussed above, using a constant voltage, using a sweeping voltage, using a sweeping voltage with current compliance, using a constant current, using a sweeping current, or using a forward bias (or forward current) with current compliance. The mechanism of soft breakdown has been discussed above, and thus relevant details will not be repeated for brevity.

After the soft breakdown process, breakdown portions 410B_A, 410B_B. 410B_C. 410B_D, 410B_E, and 410B_F are formed in the insulating layer 410, and the MIS structure 40 is transferred to a MIS memory structure 40. In greater details, the breakdown portions 410B_A, 410B_B, 410B_C. 410B_D, 410B_E, and 410B_F are formed in regions of the insulating layer 410 that are in contact with the metal electrode layers 420A, 420B, 420C, 420D, 420E, and 420F, respectively. In some embodiments, the write and read operations of the MIS memory structure have been discussed above, and thus relevant details will not be repeated for brevity.

According to the aforementioned embodiments, it can be seen that the present disclosure offers advantages in fabricating integrated circuits. It is understood, however, that other embodiments may offer additional advantages, and not all advantages are necessarily disclosed herein, and that no particular advantage is required for all embodiments. Embodiments of the present disclosure provide a method including performing a soft breakdown process to an insulating layer of a MIS structure, so as to form a oxide local thinning (OLT) spot in the insulating layer of the MIS structure. For OLT MIS structure, current saturates at a much lower voltage under positive bias, and an improved transient current was discovered by performing the pulsed voltage programs. The property makes the OLT MIS a possible candidate for dynamic memory usage.

In some embodiments of the present disclosure, a method includes forming a metal-insulator-semiconductor (MIS) structure, in which the MIS structure includes a semiconductor layer, an insulating layer over the semiconductor layer, and a metal electrode layer over the insulating layer; performing a soft breakdown process to the MIS structure to form a local breakdown portion in the insulating layer; performing a first write operation by supplying a first voltage pulse to the metal electrode layer; performing a first read operation by supplying a second voltage pulse to the metal electrode layer and detecting a first read current flowing through the MIS structure; performing a second write operation by supplying a third voltage pulse to the metal electrode layer, in which the first voltage pulse has a higher voltage level than the third voltage pulse; and performing a second read operation by supplying a fourth voltage pulse to the metal electrode layer and detecting a second read current flowing through the MIS structure, in which the first read current is different from the second read current.

In some embodiments, the soft breakdown process includes supplying a voltage to the metal electrode layer, such that the semiconductor layer is under deep depletion regime during performing the soft breakdown process.

In some embodiments, the voltage gradually increases during the soft breakdown process.

In some embodiments, the soft breakdown process further includes setting a maximum current flowing through the MIS structure.

In some embodiments, the soft breakdown process includes supplying a forward bias to the metal electrode layer, such that the semiconductor layer is under accumulation regime during performing the soft breakdown process.

In some embodiments, the semiconductor layer is a p-type semiconductor layer, and the soft breakdown process includes supplying a positive voltage to the metal electrode layer.

In some embodiments, the semiconductor layer is an n-type semiconductor layer, and the soft breakdown process includes supplying a negative voltage to the metal electrode layer.

In some embodiments, the soft breakdown process includes supplying a constant current to the metal electrode layer.

In some embodiments, the soft breakdown process includes supplying a gradually increasing current to the metal electrode layer.

In some embodiments of the present disclosure, a method includes forming an insulating layer over a semiconductor layer; forming a metal electrode layer over the insulating layer, in which the semiconductor layer, the insulating layer, and the metal electrode layer serve as a metal-insulator-semiconductor (MIS) structure; and transferring the MIS structure to a MIS memory structure, including supplying a voltage to the metal electrode layer, such that the MIS structure is under reverse bias and the semiconductor layer is under deep depletion regime; and stop supplying the voltage to the metal electrode layer until a local breakdown portion is formed in the insulating layer.

In some embodiments, the method further includes performing a first write operation to the MIS memory structure by supplying a first voltage pulse to the metal electrode layer; performing a first read operation to the MIS memory structure by supplying a second voltage pulse to the metal electrode layer and detecting a first read current flowing through the MIS structure; performing a second write operation to the MIS memory structure by supplying a third voltage pulse to the metal electrode layer, in which the first voltage pulse has a higher voltage level than the third voltage pulse; and performing a second read operation to the MIS memory structure by supplying a fourth voltage pulse to the metal electrode layer and detecting a second read current flowing through the MIS structure, in which the first read current is different from the second read current.

In some embodiments, the first read current is about two orders of magnitude the second read current.

In some embodiments, the second voltage pulse, the third voltage pulse, and the fourth voltage pulse have substantially a same level.

In some embodiments, the third voltage pulse has a lower voltage level than the second and third voltage pulses.

In some embodiments, the method further includes etching the semiconductor layer to form a fin structure protruding over the semiconductor layer, in which the insulating layer is formed lining the fin structure and the semiconductor layer, and in which the local breakdown portion is formed in a portion of the insulating layer lining the fin structure.

In some embodiments, the method further includes etching the semiconductor layer to form a recess in the semiconductor layer, in which the insulating layer is formed lining the recess and a top surface of the semiconductor layer, and in which the local breakdown portion is formed in a portion of the insulating layer lining the recess.

In some embodiments of the present disclosure, a method includes etching a semiconductor layer to form a fin structure protruding over the semiconductor layer; forming an insulating layer over the semiconductor layer and lining the fin structure; forming first and second metal electrode layers in contact with the insulating layer, in which the first metal electrode layer, the insulating layer, and the fin structure serve as a first metal-insulator-semiconductor (MIS) structure, and the second metal electrode layer, the insulating layer, and the fin structure serve as a second metal-insulator-semiconductor (MIS) structure; transferring the first MIS structure to a first MIS memory structure by supplying a first voltage to the first metal electrode layer until a first local breakdown portion is formed in the insulating layer; and transferring the second MIS structure to a second MIS memory structure by supplying a second voltage to the second metal electrode layer until a second local breakdown portion is formed in the insulating layer.

In some embodiments, the method further includes forming a dielectric layer vertically separating the first and second metal electrode layers.

In some embodiments, the first and second metal electrode layers are on opposite sides of the fin structure.

In some embodiments, transferring the second MIS structure to the second MIS memory structure is performed after the first MIS structure is transferred to the first MIS memory structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a metal-insulator-semiconductor (MIS) structure, wherein the MIS structure comprises:

a semiconductor layer;
an insulating layer over the semiconductor layer; and
a metal electrode layer over the insulating layer;
performing a soft breakdown process to the MIS structure to form a local breakdown portion in the insulating layer;
performing a first write operation by supplying a first voltage pulse to the metal electrode layer;
performing a first read operation by supplying a second voltage pulse to the metal electrode layer and detecting a first read current flowing through the MIS structure;
performing a second write operation by supplying a third voltage pulse to the metal electrode layer, wherein the first voltage pulse has a higher voltage level than the third voltage pulse; and
performing a second read operation by supplying a fourth voltage pulse to the metal electrode layer and detecting a second read current flowing through the MIS structure, wherein the first read current is different from the second read current, and wherein the third voltage pulse has a lower voltage level than the second and fourth voltage pulses.

2. The method of claim 1, wherein the soft breakdown process comprises supplying a voltage to the metal electrode layer, such that the semiconductor layer is under deep depletion regime during performing the soft breakdown process.

3. The method of claim 2, wherein the voltage gradually increases during the soft breakdown process.

4. The method of claim 2, wherein the soft breakdown process further comprises setting a maximum current flowing through the MIS structure.

5. The method of claim 1, wherein the soft breakdown process comprises supplying a forward bias to the metal electrode layer, such that the semiconductor layer is under accumulation regime during performing the soft breakdown process.

6. The method of claim 1, wherein the semiconductor layer is a p-type semiconductor layer, and the soft breakdown process comprises supplying a positive voltage to the metal electrode layer.

7. The method of claim 1, wherein the semiconductor layer is an n-type semiconductor layer, and the soft breakdown process comprises supplying a negative voltage to the metal electrode layer.

8. The method of claim 1, wherein the soft breakdown process comprises supplying a constant current to the metal electrode layer.

9. The method of claim 1, wherein the soft breakdown process comprises supplying a gradually increasing current to the metal electrode layer.

10. The method of claim 1, wherein the local breakdown portion extends downward from an interface between the metal electrode layer and the insulating layer and terminates prior to reaching an interface between the semiconductor layer and the insulating layer.

11. A method, comprising:
forming an insulating layer over a semiconductor layer;
forming a metal electrode layer over the insulating layer, wherein the semiconductor layer, the insulating layer, and the metal electrode layer serve as a metal-insulator-semiconductor (MIS) structure;
transferring the MIS structure to a MIS memory structure, comprising:

supplying a voltage to the metal electrode layer, such that the MIS structure is under reverse bias and the semiconductor layer is under deep depletion regime; and
stop supplying the voltage to the metal electrode layer until a local breakdown portion is formed in the insulating layer;
performing a first write operation to the MIS memory structure by supplying a first voltage pulse to the metal electrode layer;
performing a first read operation to the MIS memory structure by supplying a second voltage pulse to the metal electrode layer and detecting a first read current flowing through the MIS structure;
performing a second write operation to the MIS memory structure by supplying a third voltage pulse to the metal electrode layer, wherein the first voltage pulse has a higher voltage level than the third voltage pulse; and
performing a second read operation to the MIS memory structure by supplying a fourth voltage pulse to the metal electrode layer and detecting a second read current flowing through the MIS structure, wherein the first read current is different from the second read current, and wherein the third voltage pulse has a lower voltage level than the second and fourth voltage pulses.

12. The method of claim 11, wherein the first read current is about two orders of magnitude the second read current.

13. The method of claim 11, further comprising etching the semiconductor layer to form a fin structure protruding over the semiconductor layer, wherein the insulating layer is formed lining the fin structure and the semiconductor layer, and wherein the local breakdown portion is formed in a portion of the insulating layer lining the fin structure.

14. The method of claim 11, further comprising etching the semiconductor layer to form a recess in the semiconductor layer, wherein the insulating layer is formed lining the recess and a top surface of the semiconductor layer, and wherein the local breakdown portion is formed in a portion of the insulating layer lining the recess.

15. The method of claim 11, wherein the local breakdown portion extends downward from an interface between the metal electrode layer and the insulating layer and terminates prior to reaching an interface between the semiconductor layer and the insulating layer.

16. A method, comprising:
etching a semiconductor layer to form a fin structure protruding over the semiconductor layer;
forming an insulating layer over the semiconductor layer and lining the fin structure;
forming first and second metal electrode layers in contact with the insulating layer, wherein the first metal electrode layer, the insulating layer, and the fin structure serve as a first metal-insulator-semiconductor (MIS) structure, and the second metal electrode layer, the insulating layer, and the fin structure serve as a second metal-insulator-semiconductor (MIS) structure;
transferring the first MIS structure to a first MIS memory structure by supplying a first voltage to the first metal electrode layer until a first local breakdown portion is formed in the insulating layer;
transferring the second MIS structure to a second MIS memory structure by supplying a second voltage to the second metal electrode layer until a second local breakdown portion is formed in the insulating layer;
performing a first write operation by supplying a first voltage pulse to the first metal electrode layer;

performing a first read operation by supplying a second voltage pulse to the first metal electrode layer and detecting a first read current flowing through the first MIS structure;

performing a second write operation by supplying a third voltage pulse to the first metal electrode layer, wherein the first voltage pulse has a higher voltage level than the third voltage pulse; and performing a second read operation by supplying a fourth voltage pulse to the first metal electrode layer and detecting a second read current flowing through the first MIS structure, wherein the first read current is different from the second read current, and wherein the third voltage pulse has a lower voltage level than the second and fourth voltage pulses.

17. The method of claim 16, further comprising forming a dielectric layer vertically separating the first and second metal electrode layers.

18. The method of claim 16, wherein the first and second metal electrode layers are on opposite sides of the fin structure.

19. The method of claim 16, wherein transferring the second MIS structure to the second MIS memory structure is performed after the first MIS structure is transferred to the first MIS memory structure.

20. The method of claim 16, wherein the first metal electrode layer and the second metal electrode layer are vertically stacked over the semiconductor layer.

* * * * *